(12) United States Patent
Artieri et al.

(10) Patent No.: US 10,853,163 B2
(45) Date of Patent: Dec. 1, 2020

(54) OPTIMIZED ERROR-CORRECTING CODE (ECC) FOR DATA PROTECTION

(71) Applicant: QUALCOMM Incorporated, San Diego, CA (US)

(72) Inventors: Alain Artieri, San Diego, CA (US); Deepti Vijayalakshmi Sriramagiri, San Diego, CA (US); Dexter Tamio Chun, San Diego, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 5 days.

(21) Appl. No.: 15/942,372

(22) Filed: Mar. 30, 2018

(65) Prior Publication Data

US 2018/0314586 A1  Nov. 1, 2018

Related U.S. Application Data

(60) Provisional application No. 62/535,217, filed on Jul. 20, 2017, provisional application No. 62/492,052, filed on Apr. 28, 2017.

(51) Int. Cl.
*G06F 11/10* (2006.01)
*G06F 3/06* (2006.01)
(Continued)

(52) U.S. Cl.
CPC .............. *G06F 11/10* (2013.01); *G06F 3/064* (2013.01); *G06F 3/0619* (2013.01);
(Continued)

(58) Field of Classification Search
CPC ........ G06F 11/10; G06F 3/064; G06F 3/0673; G06F 3/0619; H04L 1/0057;
(Continued)

(56) References Cited

U.S. PATENT DOCUMENTS 5,889,792 A * 3/1999 Zhang ................. H03M 13/151
714/784
7,117,420 B1 * 10/2006 Yeung ................. H03M 13/095
714/763

(Continued)

OTHER PUBLICATIONS

Chen C.L., et al., "Error-Correcting Codes for Semiconductor Memory Applications: A State-of-the-Art Review," IBM Journal of Research and Development, International Business Machines Corporation, New York, NY, US, vol. 28 (2), Mar. 1, 1984, pp. 124-134, XP000652208.

(Continued)

*Primary Examiner* — Thien Nguyen
(74) *Attorney, Agent, or Firm* — Muncy, Geissler, Olds & Lowe, P.C.

(57) ABSTRACT

Disclosed are techniques for generating a parity check matrix representing an error correcting code (ECC) for protecting a plurality of bits of a message. In an aspect, a method includes initializing a matrix M to store selected three-bit codes, selecting a first three-bit code from a set L of three-bit combinations of a number of bits n of the ECC that minimizes a sum of squared row weights of each row of the matrix M, comparing the first three-bit code with each of a plurality of error syndromes, and calculating, based on no comparison of the first three-bit code with each of the plurality of error syndromes, new error syndromes and storing the new error syndromes, wherein the new error syndromes are calculated by comparing the first three-bit code with each three-bit code in the matrix M, and storing the first three-bit code in the matrix M.

16 Claims, 22 Drawing Sheets

(51) Int. Cl.
*H04L 1/00* (2006.01)
*H03M 13/19* (2006.01)
*G11C 29/52* (2006.01)
*G11C 29/02* (2006.01)
*G11C 29/04* (2006.01)

(52) U.S. Cl.
CPC .......... *G06F 3/0673* (2013.01); *H03M 13/19* (2013.01); *H04L 1/0041* (2013.01); *H04L 1/0045* (2013.01); *H04L 1/0057* (2013.01); *G11C 29/028* (2013.01); *G11C 29/52* (2013.01); *G11C 2029/0411* (2013.01)

(58) Field of Classification Search
CPC .... H04L 1/0045; H04L 1/0041; H03M 13/19; G11C 2029/0411; G11C 29/028; G11C 29/52
See application file for complete search history.

(56) References Cited

U.S. PATENT DOCUMENTS

| | | | |
|---|---|---|---|
| 8,875,002 B1 | 10/2014 | Dutta | |
| 9,071,273 B2 | 6/2015 | Resnick | |
| 9,559,726 B2 | 1/2017 | Greenspan et al. | |
| 2011/0099451 A1* | 4/2011 | Wezelenburg | G06F 11/1048 714/755 |
| 2013/0139039 A1* | 5/2013 | Sforzin | H03M 13/13 714/782 |
| 2016/0134307 A1 | 5/2016 | Hu et al. | |
| 2017/0063394 A1* | 3/2017 | Halbert | G06F 11/1068 |

OTHER PUBLICATIONS

Fujiwara E., et al., "Error-Control Coding in Computers," IEEE Computer Society, vol. 23 (7), Jul. 1, 1990, pp. 33-72, XP000137686.

Hsiao M.Y., "A Class of Optimal Minimum Odd-Weight-Column SEC-DED Codes," IBM Journal of Research and Development, International Business Machines Corporation, vol. 14 (4), Jan. 1, 1970, pp. 395-401, XP009126717.

International Search Report and Written Opinion—PCT/US2018/025690—ISA/EPO—dated Jul. 18, 2018.

Reviriego P., et al., "A Method to Construct Low Delay Single Error Correction Codes for Protecting Data Bits Only," IEEE Transactions on Computer Aided Design of Integrated Circuits and Systems, vol. 32 (3), Mar. 1, 2013, pp. 479-483, XP011494089.

* cited by examiner

| Byte 0 signal | Byte 1 signal | Beat 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| DQ7 | DQ15 | | D7 | D15 | D23 | D31 | D39 | D47 | D55 | D63 | D71 | D79 | D87 | D95 | D103 | D111 | D119 | D127 |
| DQ6 | DQ14 | | D6 | D14 | D22 | D30 | D38 | D46 | D54 | D62 | D70 | D78 | D86 | D94 | D102 | D110 | D118 | D126 |
| DQ5 | DQ14 | | D5 | D13 | D21 | D29 | D37 | D45 | D53 | D61 | D69 | D77 | D85 | D93 | D101 | D109 | D117 | D125 |
| DQ4 | DQ12 | | D4 | D12 | D20 | D28 | D36 | D44 | D52 | D60 | D68 | D76 | D84 | D92 | D100 | D108 | D116 | D124 |
| DQ3 | DQ11 | | D3 | D11 | D19 | D27 | D35 | D43 | D51 | D59 | D67 | D75 | D83 | D91 | D99 | D107 | D115 | D123 |
| DQ2 | DQ10 | | D2 | D10 | D18 | D26 | D34 | D42 | D50 | D58 | D66 | D74 | D82 | D90 | D98 | D106 | D114 | D122 |
| DQ1 | DQ9 | | D1 | D9 | D17 | D25 | D33 | D41 | D49 | D57 | D65 | D73 | D81 | D89 | D97 | D105 | D113 | D121 |
| DQ0 | DQ8 | | D0 | D8 | D16 | D24 | D32 | D40 | D48 | D56 | D64 | D72 | D80 | D88 | D96 | D104 | D112 | D120 |
| | | | | | | | | | | | | | | | | | |
| DMI0 | DMI1 | | DM0 | DM1 | DM2 | DM3 | DM4 | DM5 | DM6 | DM7 | DM8 | DM9 | DM10 | DM11 | DM12 | DM13 | DM14 | DM15 |
| | | | | | | | | | | | | | | | | | |
| ECC0 | ECC1 | | | | P0 | P1 | P2 | P3 | P4 | P5 | P6 | P7 | P8 | P9 | P10 | P11 | P12 | P13 |

*FIG. 1D*

| Byte 0 signal | Byte 1 signal | Beat 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| DQ7 | DQ15 | D7 | D15 | D23 | D31 | D39 | D47 | D55 | D63 | D71 | D79 | D87 | D95 | D103 | D111 | D119 | D127 |
| DQ6 | DQ14 | D6 | D14 | D22 | D30 | D38 | D46 | D54 | D62 | D70 | D78 | D86 | D94 | D102 | D110 | D118 | D126 |
| DQ5 | DQ14 | D5 | D13 | D21 | D29 | D37 | D45 | D53 | D61 | D69 | D77 | D85 | D93 | D101 | D109 | D117 | D125 |
| DQ4 | DQ12 | D4 | D12 | D20 | D28 | D36 | D44 | D52 | D60 | D68 | D76 | D84 | D92 | D100 | D108 | D116 | D124 |
| DQ3 | DQ11 | D3 | D11 | D19 | D27 | D35 | D43 | D51 | D59 | D67 | D75 | D83 | D91 | D99 | D107 | D115 | D123 |
| DQ2 | DQ10 | D2 | D10 | D18 | D26 | D34 | D42 | D50 | D58 | D66 | D74 | D82 | D90 | D98 | D106 | D114 | D122 |
| DQ1 | DQ9 | D1 | D9 | D17 | D25 | D33 | D41 | D49 | D57 | D65 | D73 | D81 | D89 | D97 | D105 | D113 | D121 |
| DQ0 | DQ8 | D0 | D8 | D16 | D24 | D32 | D40 | D48 | D56 | D64 | D72 | D80 | D88 | D96 | D104 | D112 | D120 |
| | | | | | | | | | | | | | | | | | |
| DMI0 | DMI1 | DM0 | DM1 | DM2 | DM3 | DM4 | DM5 | DM6 | DM7 | DM8 | DM9 | DM10 | DM11 | DM12 | DM13 | DM14 | DM15 |
| | | | | | | | | | | | | | | | | | |
| ECC0 | ECC1 | | | P0 | P1 | P2 | P3 | P4 | P5 | P6 | P7 | P8 | P9 | P10 | P11 | P12 | P13 |

210 — 6-bit Hamming Code

| | d0 | d1 | d2 | d3 | d4 | d5 | d6 | d7 | d8 | d9 | d10 | d11 | d12 | d13 | d14 | d15 | d16 | d17 | d18 | d19 | d20 | d21 | d22 | d23 | d24 | d25 | |
|---|---|---|---|---|---|---|---|---|---|---|---|---|---|---|---|---|---|---|---|---|---|---|---|---|---|---|---|
| | 1 | 0 | 1 | 0 | 0 | 1 | 0 | 1 | 0 | 0 | 1 | 1 | 0 | 1 | 0 | 0 | 1 | 1 | 1 | 0 | 0 | 1 | 0 | 1 | 1 | 1 | 15 |
| | 1 | 0 | 0 | 0 | 1 | 0 | 1 | 0 | 0 | 1 | 1 | 0 | 0 | 0 | 1 | 1 | 1 | 0 | 1 | 1 | 1 | 1 | 1 | 0 | 1 | 1 | 15 |
| | 0 | 1 | 0 | 1 | 0 | 1 | 1 | 0 | 1 | 1 | 0 | 0 | 1 | 0 | 1 | 1 | 0 | 0 | 0 | 1 | 1 | 1 | 1 | 1 | 0 | 1 | 15 |
| | 0 | 1 | 1 | 1 | 1 | 0 | 1 | 1 | 1 | 1 | 0 | 0 | 0 | 1 | 0 | 1 | 1 | 1 | 0 | 1 | 0 | 0 | 1 | 1 | 1 | 0 | 15 |
| | 0 | 0 | 1 | 1 | 0 | 1 | 0 | 0 | 0 | 1 | 0 | 1 | 1 | 0 | 1 | 1 | 1 | 1 | 0 | 1 | 1 | 1 | 0 | 0 | 1 | 1 | 15 |
| | 1 | 1 | 0 | 0 | 1 | 0 | 0 | 1 | 1 | 0 | 1 | 1 | 1 | 1 | 1 | 0 | 0 | 1 | 1 | 0 | 1 | 1 | 0 | 1 | 0 | 1 | 15 |
| | 3 | 3 | 3 | 3 | 3 | 3 | 3 | 3 | 3 | 5 | 3 | 3 | 3 | 3 | 3 | 3 | 5 | 3 | 3 | 3 | 3 | 5 | 3 | 5 | 5 | 5 | 90 |

220 — 7-bit W3C

| | d0 | d1 | d2 | d3 | d4 | d5 | d6 | d7 | d8 | d9 | d10 | d11 | d12 | d13 | d14 | d15 | d16 | d17 | d18 | d19 | d20 | d21 | d22 | d23 | d24 | d25 | |
|---|---|---|---|---|---|---|---|---|---|---|---|---|---|---|---|---|---|---|---|---|---|---|---|---|---|---|---|
| | 0 | 0 | 0 | 0 | 1 | 1 | 0 | 0 | 0 | 0 | 1 | 1 | 0 | 1 | 0 | 0 | 0 | 1 | 1 | 1 | 0 | 0 | 0 | 1 | 0 | 1 | 11 |
| | 0 | 0 | 0 | 1 | 1 | 1 | 0 | 0 | 0 | 1 | 0 | 1 | 0 | 0 | 1 | 1 | 0 | 0 | 1 | 0 | 0 | 1 | 1 | 0 | 1 | 0 | 11 |
| | 0 | 1 | 1 | 1 | 0 | 0 | 0 | 1 | 1 | 1 | 1 | 0 | 0 | 1 | 0 | 1 | 1 | 0 | 0 | 0 | 1 | 1 | 0 | 1 | 0 | 1 | 12 |
| | 0 | 1 | 1 | 0 | 0 | 0 | 0 | 0 | 0 | 1 | 0 | 0 | 1 | 1 | 1 | 0 | 1 | 1 | 0 | 1 | 0 | 0 | 1 | 0 | 1 | 0 | 11 |
| | 1 | 1 | 0 | 0 | 0 | 0 | 0 | 0 | 1 | 0 | 0 | 0 | 1 | 0 | 0 | 1 | 0 | 1 | 0 | 0 | 1 | 1 | 0 | 1 | 0 | 1 | 11 |
| | 1 | 0 | 1 | 0 | 0 | 1 | 1 | 1 | 1 | 0 | 0 | 0 | 1 | 0 | 1 | 0 | 1 | 0 | 0 | 0 | 1 | 0 | 0 | 0 | 1 | 0 | 11 |
| | 1 | 0 | 0 | 1 | 0 | 0 | 1 | 1 | 0 | 0 | 1 | 1 | 0 | 0 | 0 | 0 | 0 | 0 | 1 | 1 | 0 | 0 | 1 | 0 | 0 | 0 | 11 |
| | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 78 |

| | P8 | P7 | P6 | P5 | P4 | P3 | P2 | P1 | P0 | |
|---|---|---|---|---|---|---|---|---|---|---|
| D47 | 1 | 0 | 0 | 1 | 1 | 0 | 1 | 1 | 0 | 5 |
| D46 | 1 | 0 | 0 | 1 | 1 | 0 | 1 | 0 | 1 | 5 |
| D45 | 0 | 0 | 0 | 1 | 1 | 0 | 1 | 0 | 0 | 3 |
| D44 | 1 | 0 | 0 | 1 | 1 | 0 | 0 | 1 | 1 | 5 |
| D43 | 0 | 0 | 0 | 1 | 1 | 0 | 0 | 1 | 0 | 3 |
| D42 | 0 | 0 | 0 | 1 | 1 | 0 | 0 | 0 | 1 | 3 |
| D41 | 1 | 0 | 0 | 1 | 1 | 0 | 0 | 0 | 0 | 3 |
| D40 | 0 | 0 | 0 | 1 | 0 | 1 | 1 | 1 | 1 | 5 |
| D39 | 1 | 0 | 0 | 1 | 0 | 1 | 1 | 1 | 0 | 5 |
| D38 | 1 | 0 | 0 | 1 | 0 | 1 | 1 | 0 | 1 | 5 |
| D37 | 0 | 0 | 0 | 1 | 0 | 1 | 1 | 0 | 0 | 3 |
| D36 | 1 | 0 | 0 | 1 | 0 | 1 | 0 | 1 | 1 | 5 |
| D35 | 0 | 0 | 0 | 1 | 0 | 1 | 0 | 1 | 0 | 3 |
| D34 | 0 | 0 | 0 | 1 | 0 | 1 | 0 | 0 | 1 | 3 |
| D33 | 1 | 0 | 0 | 1 | 0 | 1 | 0 | 0 | 0 | 3 |
| D32 | 1 | 0 | 0 | 1 | 0 | 0 | 1 | 1 | 1 | 5 |
| D31 | 0 | 0 | 0 | 1 | 0 | 0 | 1 | 1 | 0 | 3 |
| D30 | 0 | 0 | 0 | 1 | 0 | 0 | 1 | 0 | 1 | 3 |
| D29 | 1 | 0 | 0 | 1 | 0 | 0 | 1 | 0 | 0 | 3 |
| D28 | 0 | 0 | 0 | 1 | 0 | 0 | 0 | 1 | 1 | 3 |
| D27 | 1 | 0 | 0 | 1 | 0 | 0 | 0 | 1 | 0 | 3 |
| D26 | 1 | 0 | 0 | 1 | 0 | 0 | 0 | 0 | 0 | 3 |
| D25 | 0 | 0 | 0 | 0 | 1 | 1 | 1 | 1 | 1 | 5 |
| D24 | 1 | 0 | 0 | 0 | 1 | 1 | 1 | 1 | 0 | 5 |
| D23 | 1 | 0 | 0 | 0 | 1 | 1 | 1 | 0 | 1 | 5 |
| D22 | 0 | 0 | 0 | 0 | 1 | 1 | 1 | 0 | 0 | 3 |
| D21 | 1 | 0 | 0 | 0 | 1 | 1 | 0 | 1 | 1 | 5 |
| D20 | 0 | 0 | 0 | 1 | 0 | 1 | 0 | 1 | 0 | 3 |
| D19 | 0 | 0 | 0 | 1 | 1 | 0 | 0 | 1 | 0 | 3 |
| D18 | 1 | 0 | 0 | 1 | 1 | 0 | 0 | 0 | 0 | 3 |
| D17 | 1 | 0 | 0 | 0 | 1 | 0 | 1 | 1 | 1 | 5 |
| D16 | 0 | 0 | 0 | 0 | 1 | 0 | 1 | 1 | 0 | 3 |
| D15 | 0 | 0 | 0 | 0 | 1 | 0 | 1 | 0 | 0 | 3 |
| D14 | 1 | 0 | 0 | 0 | 1 | 0 | 0 | 0 | 0 | 3 |
| D13 | 0 | 0 | 0 | 0 | 1 | 0 | 0 | 1 | 1 | 3 |
| D12 | 1 | 0 | 0 | 0 | 1 | 0 | 0 | 1 | 0 | 3 |
| D11 | 1 | 0 | 0 | 0 | 1 | 0 | 0 | 0 | 0 | 3 |
| D10 | 1 | 0 | 0 | 0 | 0 | 1 | 1 | 1 | 1 | 5 |
| D9 | 0 | 0 | 0 | 0 | 0 | 1 | 1 | 1 | 0 | 3 |
| D8 | 0 | 0 | 0 | 0 | 0 | 1 | 1 | 0 | 1 | 3 |
| D7 | 1 | 0 | 0 | 0 | 0 | 1 | 0 | 0 | 0 | 3 |
| D6 | 0 | 0 | 0 | 0 | 0 | 1 | 0 | 1 | 1 | 3 |
| D5 | 1 | 0 | 0 | 0 | 0 | 1 | 0 | 1 | 0 | 3 |
| D4 | 1 | 0 | 0 | 0 | 0 | 1 | 0 | 0 | 0 | 3 |
| D3 | 0 | 0 | 0 | 0 | 0 | 0 | 1 | 1 | 1 | 3 |
| D2 | 1 | 0 | 0 | 0 | 0 | 0 | 1 | 1 | 0 | 3 |
| D1 | 1 | 0 | 0 | 0 | 0 | 0 | 1 | 0 | 1 | 3 |
| D0 | 1 | 0 | 0 | 0 | 0 | 0 | 1 | 1 | 0 | 3 |

FIG. 3B

| | P8 | P7 | P6 | P5 | P4 | P3 | P2 | P1 | P0 | |
|---|---|---|---|---|---|---|---|---|---|---|
| D95 | 0 | 0 | 1 | 1 | 0 | 0 | 1 | 1 | 1 | 5 |
| D94 | 1 | 0 | 1 | 1 | 0 | 0 | 1 | 1 | 0 | 5 |
| D93 | 1 | 0 | 1 | 1 | 0 | 0 | 1 | 0 | 1 | 5 |
| D92 | 0 | 0 | 1 | 1 | 0 | 0 | 1 | 0 | 0 | 3 |
| D91 | 1 | 0 | 1 | 1 | 0 | 0 | 0 | 1 | 1 | 5 |
| D90 | 0 | 0 | 1 | 0 | 0 | 0 | 1 | 1 | 0 | 3 |
| D89 | 0 | 0 | 1 | 1 | 0 | 0 | 0 | 0 | 1 | 3 |
| D88 | 1 | 0 | 1 | 1 | 0 | 0 | 0 | 0 | 0 | 3 |
| D87 | 1 | 0 | 1 | 0 | 1 | 1 | 1 | 1 | 1 | 7 |
| D86 | 0 | 0 | 1 | 1 | 0 | 1 | 1 | 1 | 0 | 5 |
| D85 | 0 | 0 | 1 | 1 | 1 | 1 | 0 | 0 | 1 | 5 |
| D84 | 1 | 0 | 1 | 0 | 1 | 1 | 1 | 0 | 0 | 5 |
| D83 | 0 | 0 | 1 | 1 | 0 | 1 | 0 | 1 | 1 | 5 |
| D82 | 1 | 0 | 1 | 1 | 0 | 1 | 0 | 1 | 0 | 5 |
| D81 | 1 | 0 | 1 | 1 | 1 | 1 | 0 | 0 | 1 | 5 |
| D80 | 0 | 0 | 1 | 0 | 1 | 1 | 0 | 0 | 0 | 3 |
| D79 | 0 | 0 | 1 | 0 | 1 | 0 | 1 | 1 | 1 | 5 |
| D78 | 1 | 0 | 1 | 1 | 0 | 0 | 1 | 1 | 0 | 5 |
| D77 | 1 | 0 | 1 | 0 | 1 | 0 | 1 | 0 | 1 | 5 |
| D76 | 0 | 0 | 1 | 0 | 1 | 0 | 1 | 0 | 0 | 3 |
| D75 | 1 | 0 | 1 | 0 | 1 | 0 | 0 | 1 | 1 | 5 |
| D74 | 0 | 0 | 1 | 0 | 1 | 0 | 1 | 0 | 0 | 3 |
| D73 | 0 | 0 | 1 | 1 | 1 | 0 | 0 | 0 | 1 | 3 |
| D72 | 1 | 0 | 1 | 0 | 1 | 0 | 0 | 0 | 0 | 3 |
| D71 | 0 | 0 | 1 | 0 | 0 | 1 | 1 | 1 | 1 | 5 |
| D70 | 1 | 0 | 1 | 0 | 0 | 1 | 1 | 1 | 0 | 5 |
| D69 | 1 | 0 | 1 | 0 | 0 | 1 | 1 | 0 | 1 | 5 |
| D68 | 0 | 0 | 1 | 0 | 0 | 1 | 1 | 0 | 0 | 3 |
| D67 | 1 | 0 | 1 | 0 | 0 | 1 | 0 | 1 | 1 | 5 |
| D66 | 0 | 0 | 1 | 0 | 0 | 1 | 0 | 1 | 0 | 3 |
| D65 | 0 | 0 | 1 | 0 | 0 | 1 | 0 | 0 | 1 | 3 |
| D64 | 1 | 0 | 1 | 0 | 0 | 1 | 0 | 0 | 0 | 3 |
| D63 | 1 | 0 | 1 | 0 | 0 | 0 | 1 | 1 | 1 | 5 |
| D62 | 0 | 0 | 1 | 1 | 0 | 0 | 1 | 1 | 0 | 3 |
| D61 | 0 | 0 | 1 | 0 | 0 | 0 | 1 | 0 | 1 | 3 |
| D60 | 1 | 0 | 1 | 0 | 0 | 0 | 1 | 0 | 0 | 3 |
| D59 | 0 | 0 | 1 | 0 | 0 | 0 | 0 | 1 | 1 | 3 |
| D58 | 1 | 0 | 1 | 0 | 0 | 0 | 1 | 0 | 0 | 3 |
| D57 | 1 | 0 | 1 | 0 | 0 | 0 | 0 | 0 | 1 | 3 |
| D56 | 1 | 0 | 0 | 1 | 1 | 1 | 1 | 1 | 1 | 7 |
| D55 | 0 | 0 | 0 | 1 | 1 | 1 | 1 | 1 | 0 | 5 |
| D54 | 0 | 0 | 0 | 1 | 1 | 1 | 1 | 0 | 1 | 5 |
| D53 | 1 | 0 | 0 | 1 | 1 | 1 | 1 | 0 | 0 | 5 |
| D52 | 0 | 0 | 0 | 1 | 1 | 1 | 0 | 1 | 1 | 5 |
| D51 | 1 | 0 | 0 | 1 | 1 | 1 | 0 | 1 | 0 | 5 |
| D50 | 1 | 0 | 0 | 1 | 1 | 1 | 0 | 0 | 1 | 5 |
| D49 | 0 | 0 | 0 | 1 | 1 | 1 | 0 | 0 | 0 | 3 |
| D48 | 0 | 0 | 0 | 1 | 1 | 0 | 1 | 1 | 1 | 5 |

| Line | P8 | P7 | P6 | P5 | P4 | P3 | P2 | P1 | P0 | weight |
|---|---|---|---|---|---|---|---|---|---|---|
| weight | 75 | 24 | 68 | 68 | 72 | 72 | 75 | 75 | 75 | 594 |
| DDMM15 | 0 | 1 | 0 | 0 | 1 | 1 | 0 | 0 | 0 | 3 |
| DDMM14 | 0 | 1 | 0 | 0 | 1 | 0 | 1 | 1 | 1 | 5 |
| DDMM13 | 1 | 1 | 0 | 0 | 1 | 0 | 1 | 1 | 0 | 5 |
| DDMM12 | 1 | 1 | 0 | 0 | 1 | 0 | 1 | 0 | 1 | 5 |
| DDMM11 | 0 | 1 | 0 | 0 | 1 | 0 | 1 | 0 | 0 | 3 |
| DDMM10 | 1 | 1 | 0 | 0 | 1 | 0 | 0 | 1 | 1 | 5 |
| DDMM9 | 0 | 1 | 0 | 0 | 1 | 0 | 1 | 0 | 0 | 3 |
| DDMM8 | 0 | 1 | 0 | 0 | 1 | 0 | 0 | 0 | 1 | 3 |
| DDMM7 | 1 | 1 | 0 | 0 | 1 | 0 | 0 | 0 | 0 | 3 |
| DDMM6 | 0 | 1 | 0 | 0 | 0 | 1 | 1 | 1 | 1 | 5 |
| DDMM5 | 1 | 1 | 0 | 0 | 0 | 1 | 1 | 1 | 0 | 5 |
| DDMM4 | 1 | 1 | 0 | 0 | 1 | 1 | 1 | 0 | 0 | 5 |
| DDMM3 | 0 | 1 | 0 | 0 | 0 | 1 | 1 | 0 | 0 | 3 |
| DDMM2 | 1 | 1 | 0 | 0 | 0 | 1 | 0 | 1 | 1 | 5 |
| DDMM1 | 0 | 1 | 0 | 0 | 0 | 1 | 0 | 1 | 0 | 3 |
| DDMM0 | 0 | 1 | 0 | 0 | 0 | 0 | 0 | 1 | 1 | 3 |
| D127 | 1 | 1 | 0 | 0 | 0 | 0 | 0 | 0 | 1 | 3 |
| D126 | 1 | 1 | 0 | 0 | 0 | 0 | 1 | 1 | 1 | 5 |
| D125 | 0 | 1 | 0 | 0 | 0 | 0 | 1 | 1 | 0 | 3 |
| D124 | 0 | 1 | 0 | 0 | 0 | 0 | 1 | 0 | 1 | 3 |
| D123 | 1 | 1 | 0 | 0 | 0 | 0 | 1 | 0 | 0 | 3 |
| D122 | 0 | 1 | 0 | 0 | 0 | 0 | 0 | 1 | 1 | 3 |
| D121 | 1 | 1 | 0 | 0 | 0 | 0 | 0 | 1 | 0 | 3 |
| D120 | 1 | 1 | 0 | 0 | 0 | 0 | 0 | 0 | 1 | 3 |
| D119 | 0 | 0 | 1 | 1 | 1 | 1 | 1 | 1 | 1 | 7 |
| D118 | 1 | 0 | 1 | 1 | 1 | 1 | 1 | 1 | 0 | 7 |
| D117 | 1 | 0 | 1 | 1 | 1 | 1 | 0 | 1 | 1 | 7 |
| D116 | 0 | 0 | 1 | 1 | 1 | 1 | 0 | 0 | 1 | 5 |
| D115 | 1 | 0 | 1 | 1 | 1 | 0 | 1 | 1 | 1 | 7 |
| D114 | 0 | 0 | 1 | 1 | 1 | 0 | 1 | 0 | 1 | 5 |
| D113 | 0 | 0 | 1 | 1 | 1 | 0 | 1 | 1 | 0 | 5 |
| D112 | 1 | 0 | 1 | 1 | 1 | 0 | 1 | 0 | 0 | 5 |
| D111 | 1 | 0 | 1 | 1 | 1 | 0 | 1 | 1 | 1 | 7 |
| D110 | 0 | 0 | 1 | 1 | 1 | 0 | 1 | 1 | 0 | 5 |
| D109 | 0 | 0 | 1 | 1 | 1 | 0 | 1 | 0 | 1 | 5 |
| D108 | 1 | 0 | 1 | 1 | 1 | 0 | 1 | 0 | 0 | 5 |
| D107 | 0 | 0 | 1 | 1 | 1 | 0 | 0 | 1 | 1 | 5 |
| D106 | 1 | 0 | 1 | 1 | 1 | 0 | 0 | 1 | 0 | 5 |
| D105 | 1 | 0 | 1 | 1 | 0 | 0 | 0 | 1 | 1 | 5 |
| D104 | 0 | 0 | 1 | 1 | 0 | 0 | 0 | 0 | 1 | 3 |
| D103 | 1 | 0 | 1 | 1 | 0 | 1 | 1 | 1 | 1 | 7 |
| D102 | 0 | 0 | 1 | 1 | 0 | 1 | 1 | 0 | 1 | 5 |
| D101 | 1 | 0 | 1 | 0 | 0 | 1 | 1 | 0 | 1 | 5 |
| D100 | 0 | 0 | 1 | 1 | 0 | 1 | 1 | 0 | 1 | 5 |
| D99 | 0 | 0 | 1 | 0 | 1 | 0 | 1 | 1 | 1 | 5 |
| D98 | 1 | 0 | 0 | 1 | 1 | 0 | 1 | 1 | 0 | 5 |
| D97 | 1 | 0 | 1 | 0 | 1 | 0 | 0 | 1 | 1 | 5 |
| D96 | 0 | 0 | 1 | 1 | 0 | 1 | 0 | 0 | 0 | 3 |

FIG. 3C

*FIG. 3D* Encoding W3C Parity Check Matrix

FIG. 3E Encoding W3C Parity Check Matrix

FIG. 3F  Encoding W3C Parity Check Matrix

Decoding W3C Parity Check Matrix

FIG. 3H

Decoding W3C Parity Check Matrix

*FIG. 3I*

Decoding W3C Parity Check Matrix

OPTIMIZED ERROR-CORRECTING CODE (ECC) FOR DATA PROTECTION

CROSS-REFERENCE TO RELATED APPLICATIONS

The present Application for Patent claims the benefit of U.S. Provisional Application No. 62/492,052, entitled "OPTIMIZED ERROR-CORRECTING CODE FOR DATA PROTECTION," filed Apr. 28, 2017, and U.S. Provisional Application No. 62/535,217, entitled "OPTIMIZED ERROR-CORRECTING CODE FOR DATA PROTECTION," filed Jul. 20, 2017, each assigned to the assignee hereof, and each expressly incorporated herein by reference in their entirety.

BACKGROUND

1. Field of the Disclosure

Aspects of the disclosure relate to optimizing an error-correcting code (ECC) for data protection.

2. Description of the Related Art

A high-speed link, such as the interface between a System on Chip (SoC) and another electronic device, e.g., random access memory (RAM), dynamic RAM (DRAM), double data rate (DDR) DRAM, low power DDR synchronous DRAM (LPDDR SDRAM), etc., are typically protected by some sort of error correction. There are two general techniques for error correction of data transferred over a data link. The first is referred to as automatic repeat request (ARQ) (also referred to as backward error correction). In ARQ, an error detection scheme is combined with requests for retransmission of corrupted data. More specifically, the receiver checks each block of data received using an error detection code, and if the check fails, requests retransmission of the block of data. The receiver will repeatedly request retransmission of the block of data until the block of data can be verified.

The second error correction technique is referred to as forward error correction (FEC). Here, the sender encodes the data using an ECC prior to transmission. The receiver uses the ECC to recover the original data. In general, the reconstructed data is determined to be the "most likely" original data. An ECC can detect and correct common types of internal data corruption (e.g., errors during writing, reading, storing, transmitting, processing, etc.). In order to detect errors, an ECC adds a parity bit to a group of source bits to ensure that the number of set bits (i.e., bits with a value of "1") in the outcome is even or odd. Adding a parity bit is a simple scheme that can detect an odd number (e.g., one, three, five, etc.) of errors in the output. An even number of flipped bits will make the parity bit appear correct even though the data is erroneous.

ARQ and FEC techniques may be combined, such that minor errors are corrected without retransmission, and major errors are corrected via a request for retransmission. This is referred to as hybrid automatic repeat-request (HARQ).

SUMMARY

The following presents a simplified summary relating to one or more aspects disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a method for generating a parity check matrix representing an ECC for protecting a plurality of bits of a message includes initializing a matrix M to store selected three-bit codes, wherein each row of the matrix M is associated with a row weight, and wherein the row weight of each row of the matrix M indicates a number of set bits in the row, selecting a first three-bit code from a set L of three-bit combinations of a number of bits n of the ECC that minimizes a sum of squared row weights of each row of the matrix M, comparing the first three-bit code with each of a plurality of error syndromes in a set D of error syndromes, and, based on no comparison of the first three-bit code with each of the plurality of error syndromes in the set D of error syndromes matching a three-bit code in the matrix M, calculating new error syndromes and storing the new error syndromes in the set D of error syndromes, wherein the new error syndromes are calculated by comparing the first three-bit code with each three-bit code in the matrix M, and storing the first three-bit code in the matrix M.

In an aspect, an apparatus for detecting an error in a plurality of bits of a message protected by an ECC includes a parity bit encoder configured to receive the plurality of bits of the message and to output a plurality of parity bits for the plurality of bits of the message, wherein a number of the plurality of parity bits is greater than a minimum number of bits required for single error correction and double error detection (SECDED) protection of the plurality of bits of the message, wherein the ECC comprises a plurality of bits, and wherein a number of the plurality of bits of the ECC is greater than the minimum number of bits required for SECDED protection of the plurality of bits of the message, a first comparator configured to compare the plurality of parity bits to the plurality of bits of the ECC and to output an error syndrome, wherein the error syndrome comprises a plurality of bits representing results of comparisons between the plurality of parity bits and the plurality of bits of the ECC, an error locator configured to receive the error syndrome and to output an error location vector representing which bits of the plurality of bits of the message are in error, and a second comparator configured to compare the error location vector to the plurality of bits of the message and to output a corrected version of the plurality of bits of the message.

In an aspect, a non-transitory computer-readable medium storing computer-executable instructions for generating a parity check matrix representing an ECC for protecting a plurality of bits of a message includes computer-executable instructions comprising at least one instruction for initializing a matrix M to store selected three-bit codes, wherein each row of the matrix M is associated with a row weight, and wherein the row weight of each row of the matrix M indicates a number of set bits in the row, at least one instruction for selecting a first three-bit code from a set L of three-bit combinations of a number of bits n of the ECC that minimizes a sum of squared row weights of each row of the matrix M, at least one instruction for comparing the first three-bit code with each of a plurality of error syndromes in a set D of error syndromes, and at least one instruction for calculating, based on no comparison of the first three-bit code with each of the plurality of error syndromes in the set D of error syndromes matching a three-bit code in the matrix M, new error syndromes and storing the new error syndromes in the set D of error syndromes, wherein the new error syndromes are calculated by comparing the first three-bit code with each three-bit code in the matrix M, and storing the first three-bit code in the matrix M.

In an aspect, an apparatus for detecting an error in a plurality of bits of a message protected by an ECC includes means for parity bit encoding configured to receive the plurality of bits of the message and to output a plurality of parity bits for the plurality of bits of the message, wherein a number of the plurality of parity bits is greater than a minimum number of bits required for SECDED protection of the plurality of bits of the message, wherein the ECC comprises a plurality of bits, and wherein a number of the plurality of bits of the ECC is greater than the minimum number of bits required for SECDED protection of the plurality of bits of the message, a first means for comparing configured to compare the plurality of parity bits to the plurality of bits of the ECC and to output an error syndrome, wherein the error syndrome comprises a plurality of bits representing results of comparisons between the plurality of parity bits and the plurality of bits of the ECC, a means for error locating configured to receive the error syndrome and to output an error location vector representing which bits of the plurality of bits of the message are in error, and a second means for comparing configured to compare the error location vector to the plurality of bits of the message and to output a corrected version of the plurality of bits of the message.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

FIGS. 1D and 1E are tables of the bit positions within a 16-bit or 32-bit data burst according to aspects of the disclosure.

FIG. 2 illustrates a comparison between a 6-bit ECC parity matrix and a 7-bit ECC parity matrix according to at least one aspect of the disclosure.

FIGS. 3A-3I illustrate a comparison between a 9-bit Hamming code parity matrix and a 14-bit "weight 3 code" parity matrix according to at least one aspect of the disclosure.

DETAILED DESCRIPTION

Figure 1A:
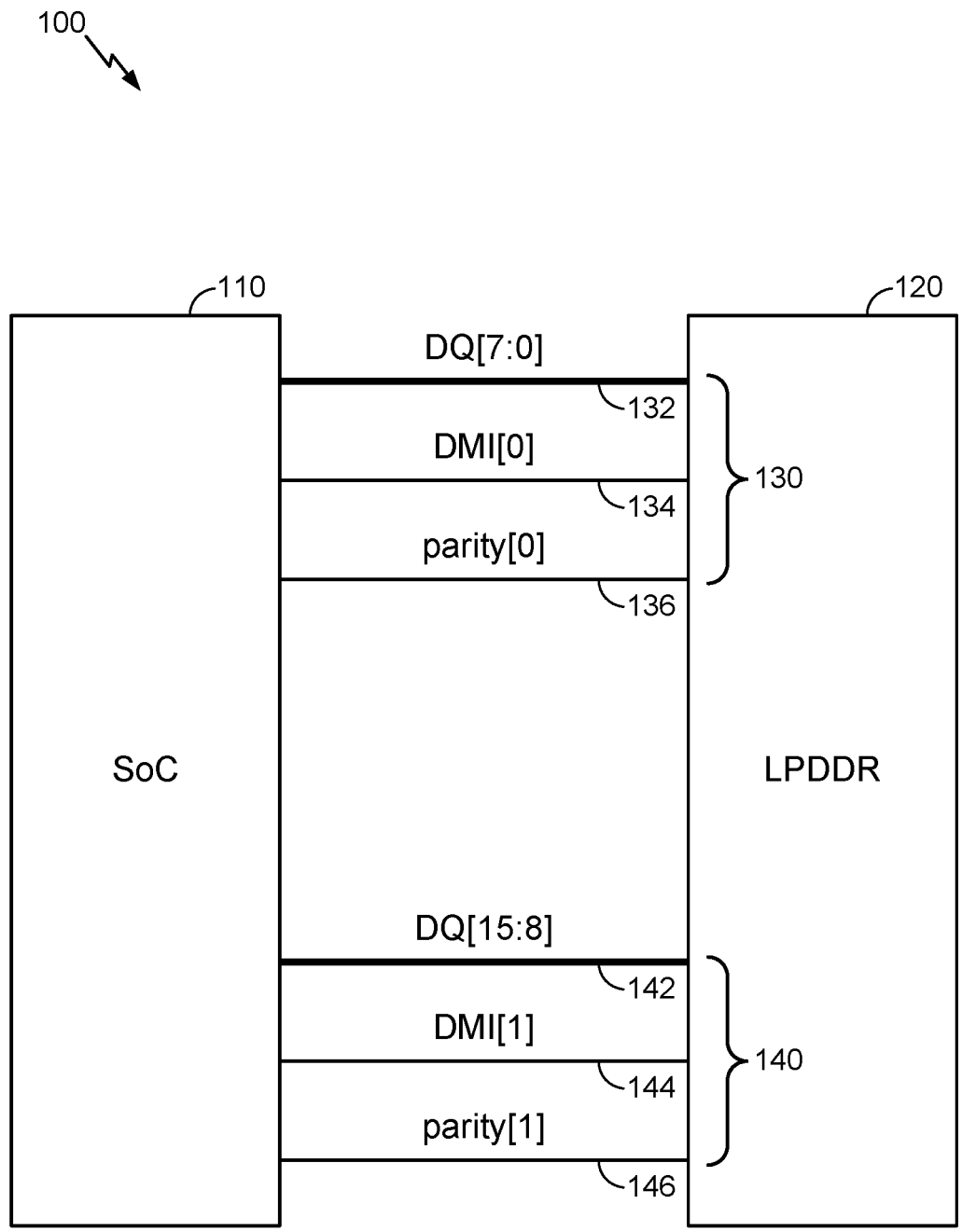
FIG. 1A illustrates an exemplary LPDDR system according to at least one aspect of the disclosure.

Disclosed are techniques for generating a parity check matrix representing an ECC for protecting a plurality of bits of a message. In an aspect, a method includes initializing a matrix M to store selected three-bit codes, wherein each row of the matrix M is associated with a row weight, and wherein the row weight of each row of the matrix M indicates a number of set bits in the row, selecting a first three-bit code from a set L of three-bit combinations of a number of bits n of the ECC that minimizes a sum of squared row weights of each row of the matrix M, comparing the first three-bit code with each of a plurality of error syndromes in a set D of error syndromes, and calculating, based on no comparison of the first three-bit code with each of the plurality of error syndromes in the set D of error syndromes matching a three-bit code in the matrix M, new error syndromes and storing the new error syndromes in the set D of error syndromes, wherein the new error syndromes are calculated by comparing the first three-bit code with each three-bit code in the matrix M, and storing the first three-bit code in the matrix M.

In an aspect, an apparatus for detecting an error in a plurality of bits of a message protected by an ECC includes a parity bit encoder configured to receive the plurality of bits of the message and to output a plurality of parity bits for the plurality of bits of the message, wherein a number of the plurality of parity bits is greater than a minimum number of bits required for SECDED protection of the plurality of bits of the message, wherein the ECC comprises a plurality of bits, and wherein a number of the plurality of bits of the ECC is greater than the minimum number of bits required for SECDED protection of the plurality of bits of the message, a first comparator configured to compare the plurality of parity bits to the plurality of bits of the ECC and to output an error syndrome, wherein the error syndrome comprises a plurality of bits representing results of comparisons between the plurality of parity bits and the plurality of bits of the ECC, an error locator configured to receive the error syndrome and to output an error location vector representing which bits of the plurality of bits of the message are in error, and a second comparator configured to compare the error location vector to the plurality of bits of the message and to output a corrected version of the plurality of bits of the message.

These and other aspects of the disclosure are disclosed in the following description and related drawings directed to specific aspects of the disclosure. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Further, various aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

LPDDR SDRAM, also referred to as "mobile DDR," is typically used for mobile devices due to its smaller size on-chip and lower power consumption compared to standard SDRAM. For example, in contrast with standard SDRAM, which typically uses a 64-bit wide high-speed data link (commonly referred to as a memory bus), LPDDR uses a 16- or 32-bit wide high-speed data link to transfer data from the System on Chip (SoC) device to the LPDDR memory module and vice versa. LPDDR5 is the fifth generation of LPDDR SDRAM.

FIG. 1 illustrates an exemplary LPDDR system 100 according to at least one aspect of the disclosure. The LPDDR system 100 includes an SoC device 110 and an LPDDR memory module 120 (e.g., an LPDDR5 memory module). The SoC device 110 is coupled to the LPDDR memory module 120 via a high-speed data link (memory bus) comprising two lanes 130 and 140. Each lane 130 and 140 is made up of eight data (DQ) connections 132 and 142, respectively, between the SoC device 110 and the LPDDR memory module 120. Each connection of the eight DQ connections 132, 142 corresponds to a bit of a byte and permits the transmission of data between the SoC device 110 and the LPDDR memory module 120. As such, the lanes 130 and 140 may be referred to as one-byte lanes. Each lane 130 and 140 further includes one data mask-inversion (DMI) connection 134 and 144, respectively, to transmit a one-bit data mask-inversion (also referred to as simply "data mask" or "DM") and one parity connection 136 and 146, respectively, to transmit ECC parity bits.

In the example of FIG. 1, an elementary data transfer over a lane (e.g., lane 130) consists of 16 beats. At each beat, there is a transfer of eight bits (or one byte) of data over the eight DQ connections 132 and one bit for the data mask-inversion over the DMI connection 134. Thus, at the end of an elementary data transfer, 128 data bits and 16 data mask-inversion bits will have been transferred over lane 130. This means that a 144-bit message can be transferred over lane 130 during an elementary data transfer. The same applies to lane 140.

A minimum of a 9-bit ECC is needed for SECDED protection of the data being transferred over the eight DQ connections 132 or 142 during an elementary data transfer. A common 9-bit ECC that can be used for this type of correction is a 9-bit Hamming code. The nine bits of a 9-bit ECC are transferred over the parity connection 136 or 146 during the 16 beats of the elementary data transfer. However, because there are 16 beats, up to a 14-bit ECC (typically, two beats of the 16 beats are reserved for other purposes), rather than the minimum 9-bit ECC, could be transferred during an elementary data transfer. An ECC having more than the minimum number of bits required for SECDED protection of the bits of a message being transferred during an elementary data transfer is referred to herein as a "weight 3 code," or "W3C." Note that SECDED protection means that 100% of single bit errors are corrected and 100% of double bit errors are detected. However, more errors can be detected. For example, when the syndrome is not "0" and does not match any of the code values, then a multiple error of three erroneous bits or more can be detected. Not all multiple errors with three erroneous bits or more can be detected, however. For example, when the syndrome is "0," the errors will go undetected, but when the syndrome is equal to one of the code values, it appears as a single bit error but the data is miscorrected. The better the code, the lower the number of miscorrected and non-detected multiple errors. By using more than the minimum number of bits required for SECDED protection, a W3C can provide improved multiple error detection as shown in Table 1 below.

Figure 1B:
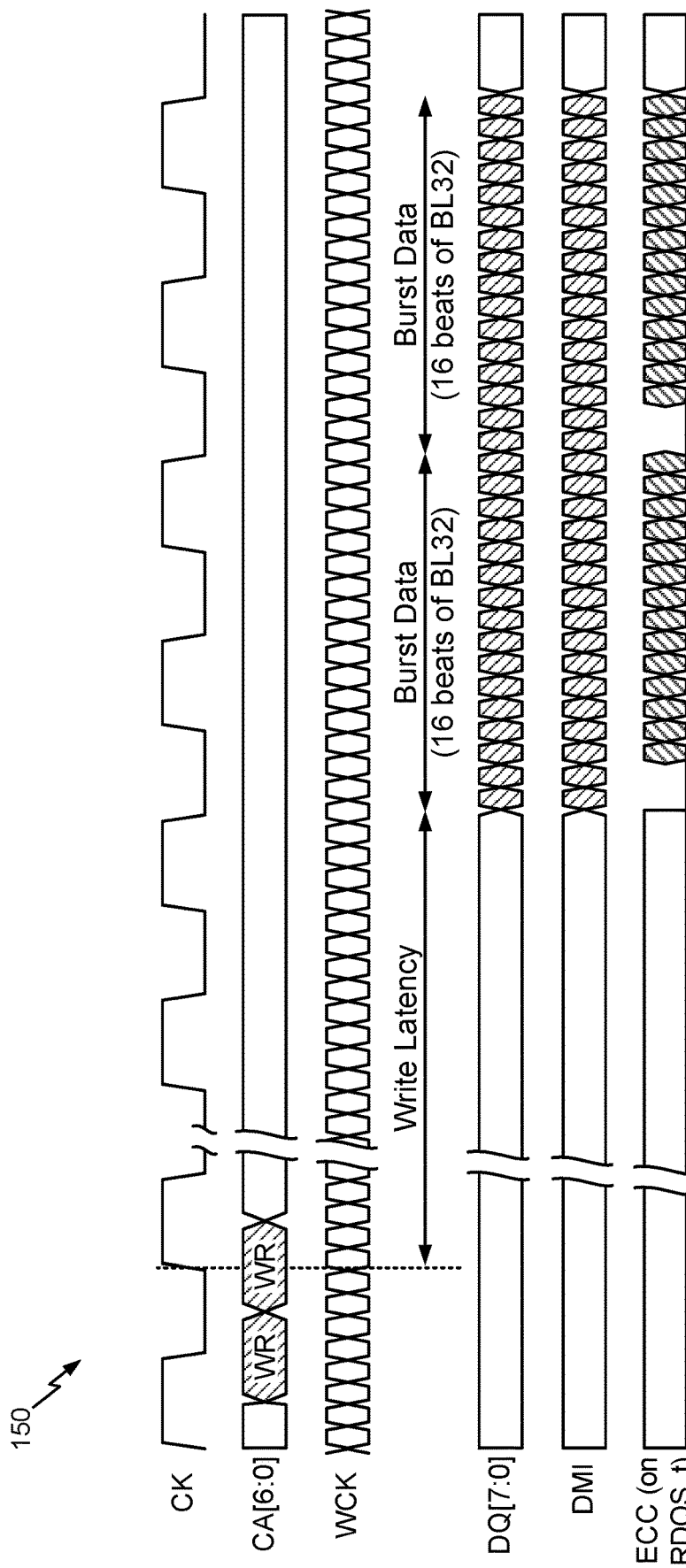
FIGS. 1B and 1C illustrate exemplary Read and Write command timing diagrams showing an ECC transfer according to aspects of the disclosure.

FIG. 1B is an exemplary Write command timing diagram 150 showing an ECC transfer according to at least one aspect of the disclosure. Timing diagram 150 is described with reference to the example LPDDR system 100 in FIG. 1A. As illustrated in FIG. 1B, after some Write command latency, over the period of 16 beats, 128 bits of data will be transferred across the eight pins of the DQ connections 132 and/or 142 and 16 DM bits will be transferred across the DMI connection 134 and/or 144. When link ECC is enabled (i.e., ECC is enabled to protect the data transferred over, e.g., the eight DQ connections 132 and/or 142) during a Write burst (e.g., an elementary data transfer over a lane), the 14-bit ECC will be received by the DRAM (e.g., LPDDR memory module 120) on the ECC pin (e.g., parity connection 136 and/or 146) along with the Write data on the DQ pins (e.g., the eight DQ connections 132 and/or 142). In that way, the destination of the Write command (e.g., the LPDDR memory module 120) will be able to use the received ECC to check all 128 data bits transferred across the eight DQ connections 132 and/or 142 and all 16 DM bits transferred across the DMI connection 134 and/or 144.

Figure 1C:
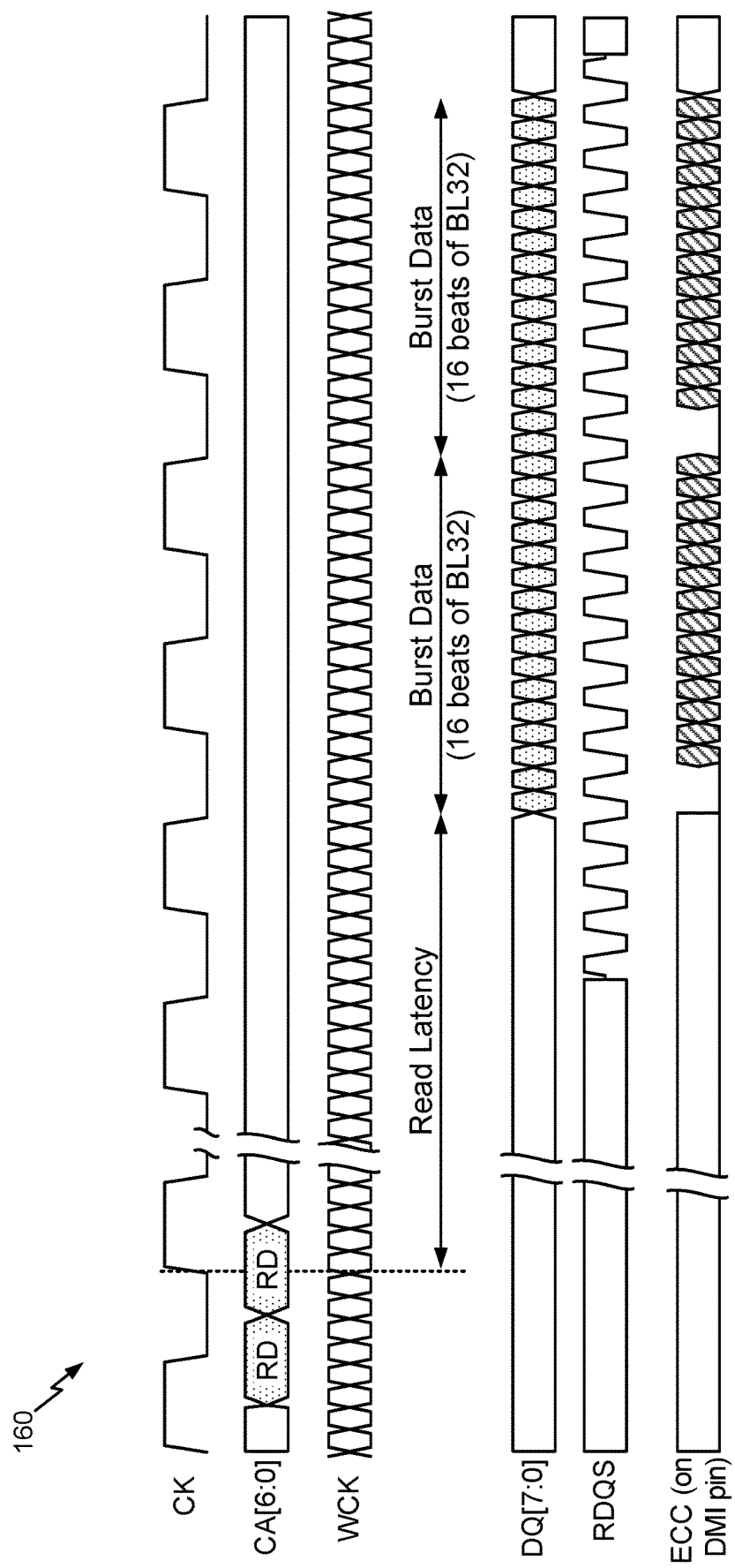

FIG. 1C is an exemplary Read command timing diagram 160 showing an ECC transfer according to at least one aspect of the disclosure. Timing diagram 160 is described with reference to the example LPDDR system 100 in FIG. 1A. As illustrated in FIG. 1C, after some Read command latency, over the period of 16 beats, 128 bits of data will be transferred across the eight pins of the DQ connections 132 and/or 142. When link ECC is enabled (i.e., ECC is enabled to protect the data transferred over, e.g., the eight DQ connections 132 and/or 142) during a Read burst (e.g., an elementary data transfer over a lane), the 14-bit ECC will be transmitted from the DRAM (e.g., LPDDR memory module 120) on the ECC pin (e.g., parity connection 136 and/or 146) along with the Read data on the DQ pins (e.g., the eight DQ connections 132 and/or 142). In that way, the ECC will be generated across all 128 data bits of the Read data. Since there are no DM bits transmitted across the bus during a Read operation, the 16 DM bits will be treated as zeros by both the ECC generation logic and the ECC checking logic.

FIG. 1D is a table 170A of the bit positions within a 16 beat burst (referred to as a "BL16 burst") or the first half of a 32 beat burst (referred to as a "BL32 burst"). FIG. 1E is a table 170B of the bit positions within the second half of a 32 beat burst. These figures illustrate the bit locations within a burst for all 128 data bits, 16 DM bits, and 14 ECC bits. A BL16 burst consists of 16 consecutive data beats, and a BL32 burst consists of 32 consecutive data beats. The ECC is calculated on 16-beat quantities, so a BL32 burst has two separate ECC calculations per byte, each of them identical. The first ECC calculation is performed on beats 0-15 of the burst, and the second is performed on beats 16-31. Link ECC is also calculated on each byte of the interface independently. The "Byte 0 Signal" and "Byte 1 Signal" columns in FIGS. 1D and 1E denote which pins are involved in each calculation respectively. The bit positions illustrated in FIGS. 1D and 1E will be referenced in the ECC check matrix definitions that follow.

An ECC is represented by a parity matrix (also referred to as a "parity check matrix"). For simplicity, FIG. 2 illustrates a comparison between a 6-bit Hamming code parity matrix 210 and a 7-bit W3C parity matrix 220 according to at least one aspect of the disclosure. Each parity matrix 210 and 220 is for a 26-bit message (d0-d25). Although not illustrated in FIG. 2, each parity bit of the ECC is the XOR of each "set" input data bit (i.e., each input data bit d0 to d25 having a value of "1") in the matrix row corresponding to that parity bit. Note that the parity matrices 210 and 220 do not include DM bits. If they did, they would be treated as data bits, as shown below with reference to FIGS. 3A-3C and 3D-3E. The number below each column of the matrix is the weight of the column and indicates the number of set bits in the column. The number to the right of each row (or line) of the matrix is the weight of the row and indicates the number of set bits in the row. The bottom right cell in each matrix is the weight of the matrix (i.e., the sum of all set bits in the matrix).

The weight of a line in the matrix is the XOR input width (i.e., the number of inputs to the XOR gate) needed to calculate the parity bit for that line. Thus, a line weight of "15," for example, indicates that a 15-input XOR gate is needed to calculate the parity bit. As such, the maximum line weight indicates the largest XOR gate needed to calculate the ECC bits. The weight of the matrix (i.e., the sum of all set bits in the matrix) indicates the total, un-optimized, gate input count for calculating the ECC bits. However, in practice, the gate input count can be reduced. For example, the XOR of a given portion (i.e., sequence of columns) of a first row may be calculated, and can then be reused in the XOR calculations of other rows that have the same set bits for the same sequence of columns as the first row. Hence, assuming a 16-column sequence of a row of a matrix and three rows having the same set bits for that 16-column sequence, the gate input count would not be 16*3=48, but rather, 16+2=18. As such, the matrix weight indicates the gate counts without reflecting the optimization possibilities.

Figure 5:
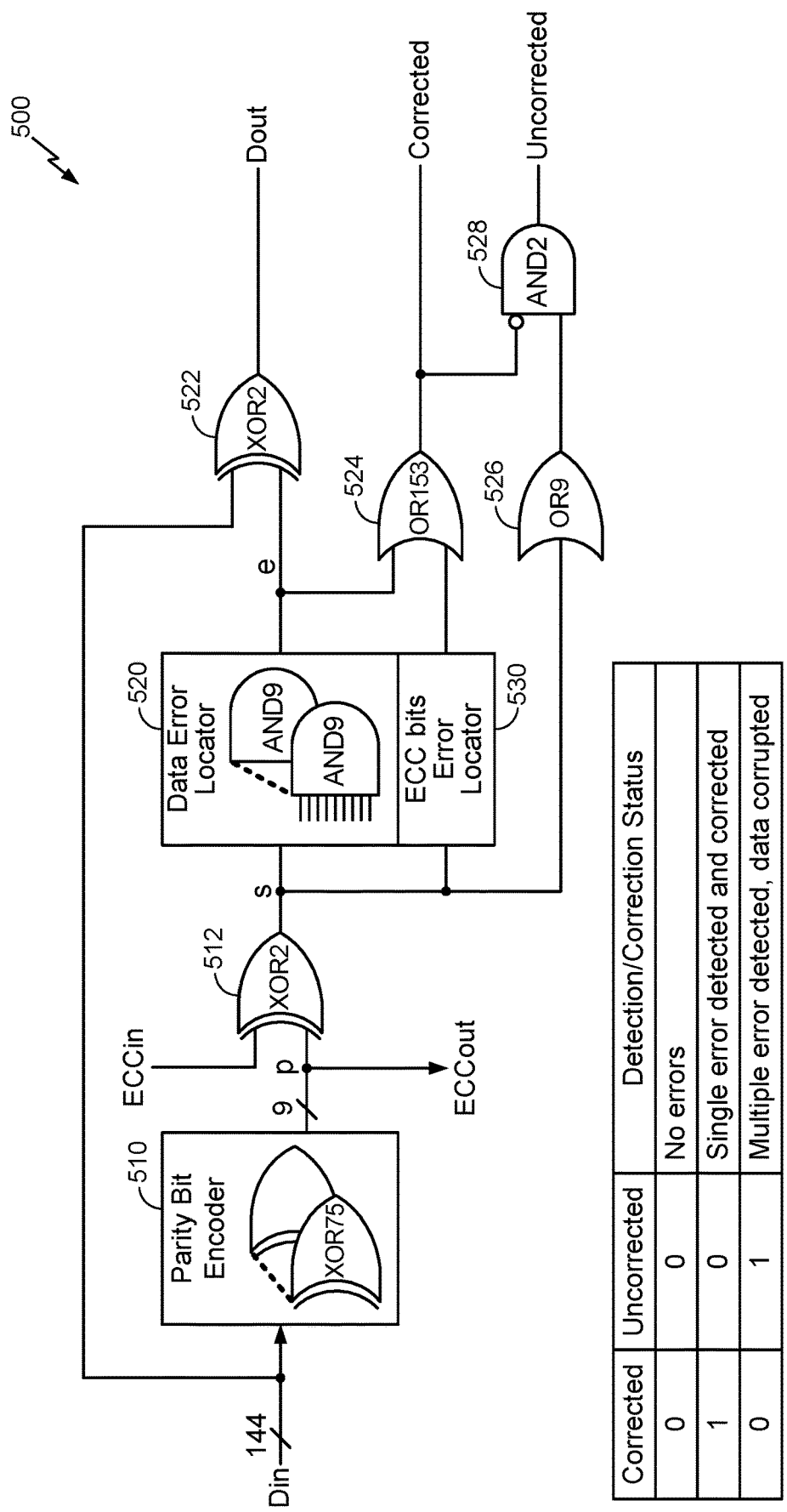
FIG. 5 illustrates an exemplary ECC module for a 9-bit ECC (e.g., a 9-bit Hamming code) according to at least one aspect of the disclosure.
Figure 6A:
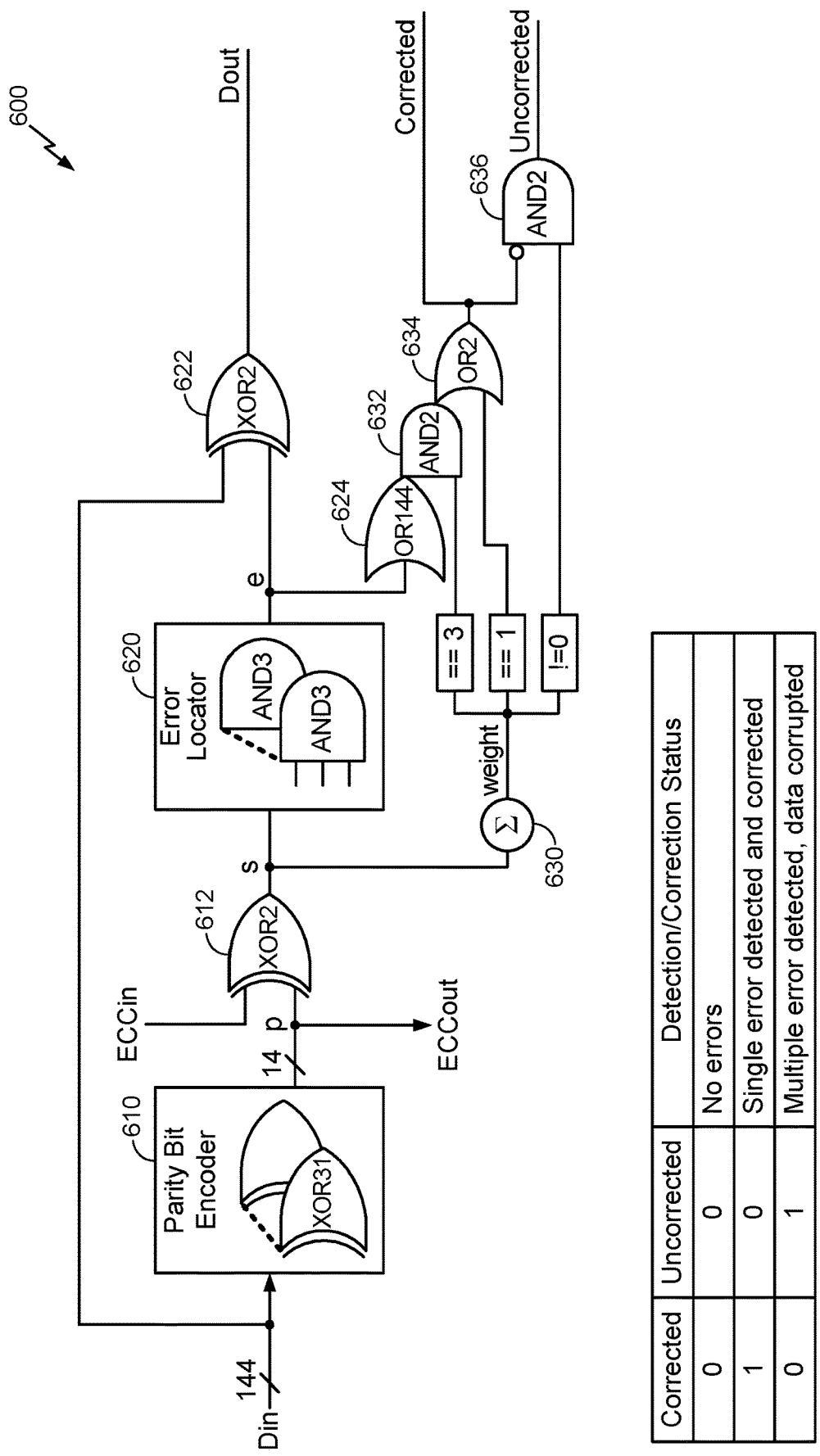
FIG. 6A illustrates an exemplary ECC module for a 14-bit "weight 3 code" according to at least one aspect of the disclosure.

The lower the row and matrix weights, the more optimized will be the ECC. As described further herein, when there is an error, the location of the erroneous bit is calculated by decoding the error syndrome according to the value in each column. If the weights of all of the columns are equal, then the decoding can be optimized. More specifically, in this case, the error locator can be optimized, as it will only require AND gates having a number of inputs equal to the weight of the columns (as illustrated in FIG. 6A). Otherwise, it would require AND gates with a number of inputs equal to the total number of ECC bits (as illustrated in FIG. 5).

As illustrated in FIG. 2, the 6-bit Hamming code parity matrix 210 includes six parity bits for a total message length of 26 bits. In contrast, the 7-bit W3C parity matrix 220 includes seven parity bits. As can be seen in FIG. 2, by increasing the number of bits used to represent the ECC from six bits to seven bits, the largest line weight is reduced from 15 to 12 and the largest column weight is reduced from five to three, for a total gate indicator reduction from 90 to 78. Note that all the columns of matrix 220 have the same weight of three, hence the name "weight 3 code."

FIGS. 3A-3I illustrate a comparison between a 9-bit Hamming code parity check matrix 310 (illustrated in FIGS. 3A, 3B, and 3C in three portions 310A, 310B, and 310C, respectively) and 14-bit W3C parity check matrices 320 (illustrated in FIGS. 3D, 3E, and 3F in three portions 320A, 320B, and 320C, respectively) and 330 (illustrated in FIGS. 3G, 3H, and 3I in three portions 330A, 330B, and 330C, respectively) according to at least one aspect of the disclosure. Each row of the matrix represents the input data bits (D0-D127) and the data mask-inversion bits (DM0-DM15). To the left of each row of the matrix is the corresponding parity bit: P0-P8 for the 9-bit Hamming code parity check matrix 310, and P0-P13 for the 14-bit W3C parity check matrices 320 and 330. As noted above, each parity bit is the XOR of each "set" input bit (i.e., each input bit D0-D127 and DM0-DM15 having a value of "1") in the matrix line corresponding to the parity bit. Thus, for example, for the 9-bit Hamming code parity check matrix 310, the set bits in the row for the parity bit P7 are D120-D127 and DM0-DM15. As such, the parity bit P7= D120⊕D121⊕D122⊕D123⊕D124⊕D125⊕D126⊕ D127⊕DM0⊕DM1⊕DM2⊕DM3⊕DM4⊕DM5⊕ DM6⊕DM7⊕DM8⊕DM9⊕DM10⊕DM11⊕DM12⊕ DM13⊕DM14⊕DM15, which requires a 24-input XOR gate to calculate.

Below each column of the matrix is the weight of that column. The weight of a column is the number of set bits in the column and indicates the ECC for that input bit. To determine whether or not there is an error in the received data (e.g., the data received over the eight DQ connections 132 and the DMI connection 134 of lane 130), the error locator logic of the receiver (e.g., LPDDR memory module 120) calculates the error syndrome for the received data. The receiver uses the parity check matrix to compute the error syndrome. If the error syndrome is the null vector (i.e., all zeros), then the received data is considered error-free. If, however, the error syndrome is non-zero, then the value either indicates which bit has been flipped and can be corrected or indicates there are multiple errors that cannot be corrected. In an aspect, the error syndrome is the XOR between the incoming parity bits of the ECC (e.g., received over parity connection 136 and/or 146) and the parity bits calculated from the incoming data bits (which are calculated the same way that the sender calculates them on the transmitted data bits). The error locator logic then compares the error syndrome to the corresponding parity bits of the ECC. If an ECC matches the syndrome, then the input bit has an error and should be flipped. For example, for the 9-bit Hamming code parity check matrix 310, the error syndrome matching condition for D0 is calculated as error(D0)=s8 & !s7 & !s6 & !s5 & !s4 & !s3 & !s2 & s1 & s0, where $s_n = P_n \oplus ECCin_n$, $P_n$ is the calculated parity bit n, and $ECCin_n$ is the received parity bit n. Note that s8, s1, and s0 are not negated (!), as are s7, s6, s5, s4, s3, and s2, because s8, s1, and s0 correspond to "set" bits while the others do not. In contrast, the weight for all of the 14-bit W3C parity matrix codes is "3," making possible a simpler implementation of the error locator. Specifically, as mentioned above, the error locator can be optimized, as it will only require AND gates having a number of inputs equal to the weight of the columns (as illustrated in FIG. 6A). Otherwise, it would require AND gates with a number of inputs equal to the total number of ECC bits (as illustrated in FIG. 5).

To the right of the matrix is the weight of each line, which, as noted above, is the XOR input width to calculate the parity bit. The maximum line weight is an indicator of the encoder critical path depth. As in FIG. 2, the bottom right cell in each matrix is the weight of the matrix (i.e., the sum of all set bits in the matrix). As can be seen, by increasing the number of bits used to represent the ECC from nine bits to 14 bits, the largest line weight is reduced from 75 to 31 and the largest column weight is reduced from seven to three for a total XOR tree input decrease of 594 to 432.

Referring to FIGS. 3D-3F, the 14-bit W3C parity check matrix 320 is an ECC encoding check matrix. That is, it is the parity check matrix used by the sender to generate the ECC bits. On a write burst, DM0-DM15 are included in both the ECC generation and checking. On a Read burst, however, DM0-DM15 are treated as zeros by both the ECC generation and ECC checking logic. The 14-bit W3C parity check matrix 320 should be interpreted as follows. Scanning across from each ECC bit on the left (P0-P13), wherever a "1" appears in that row of the matrix, the input bit at the top of that column is included in the XOR tree for that ECC bit. For example, P13=DM15 ⊕DM11 ⊕DM5 ⊕DM0 ⊕D126 ⊕ . . . D14 ⊕D8 ⊕D7 ⊕D2.

Figure 3A:
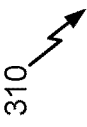
Figure 3D:
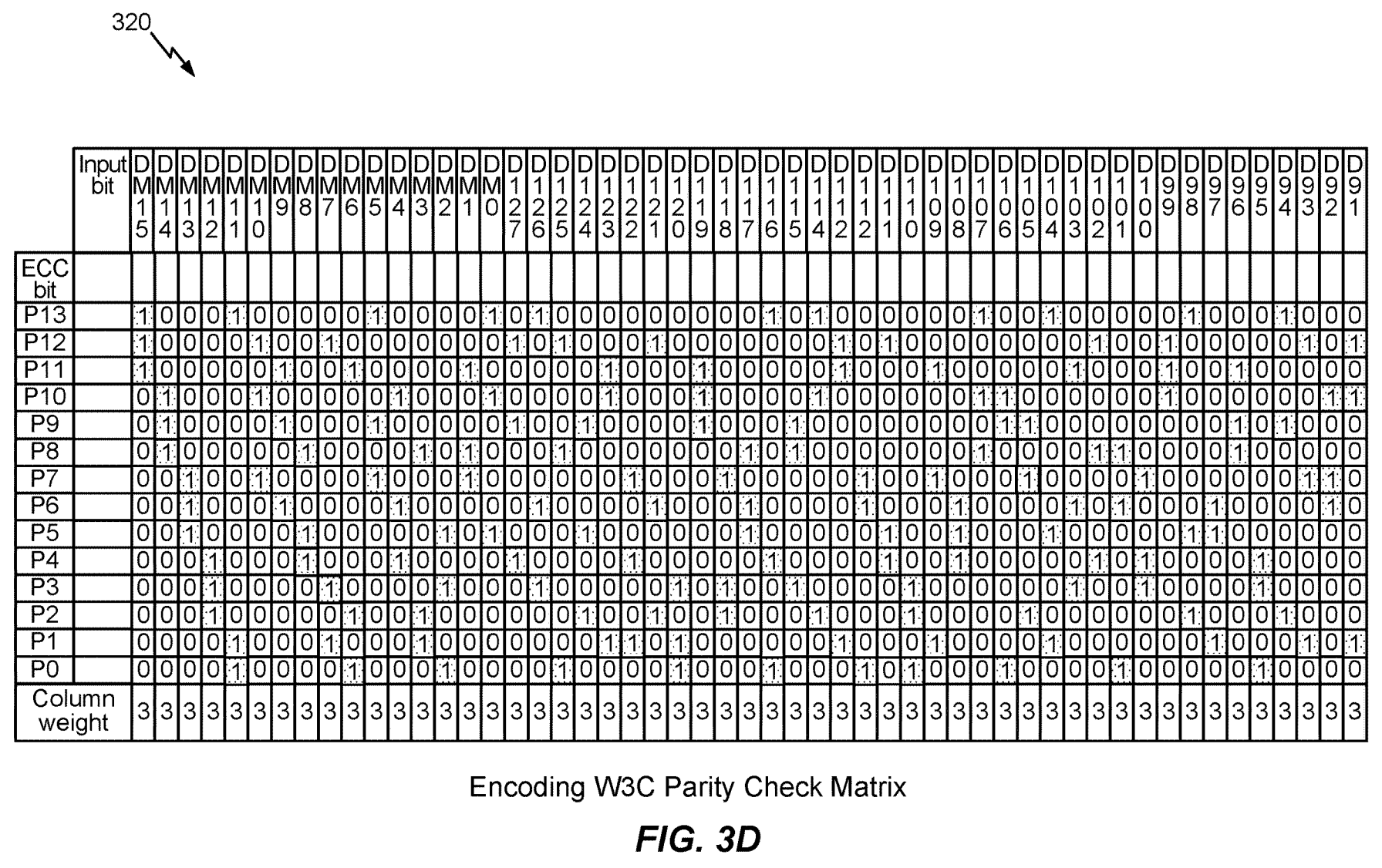
Figure 3E:
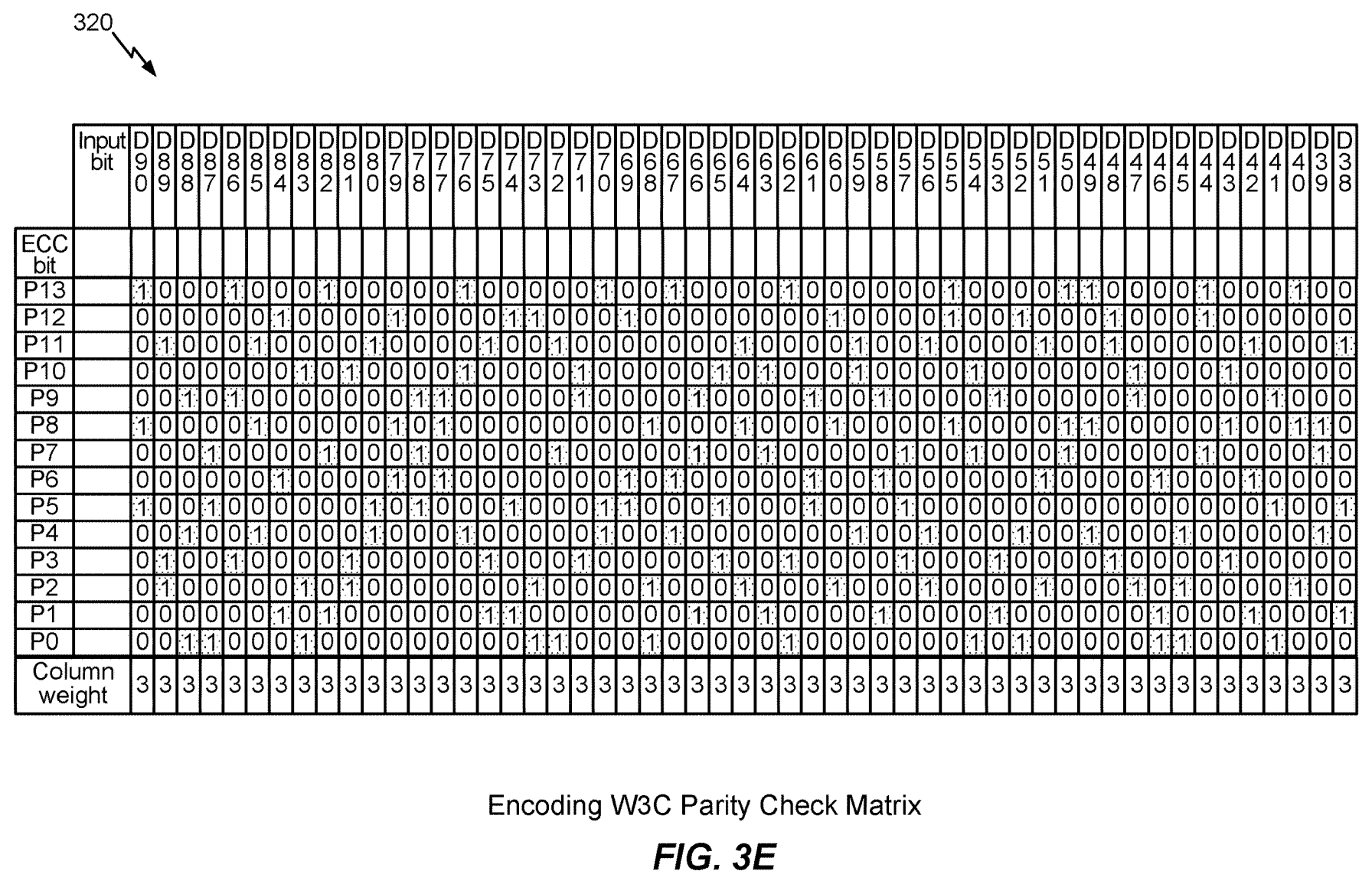
Figure 3F:
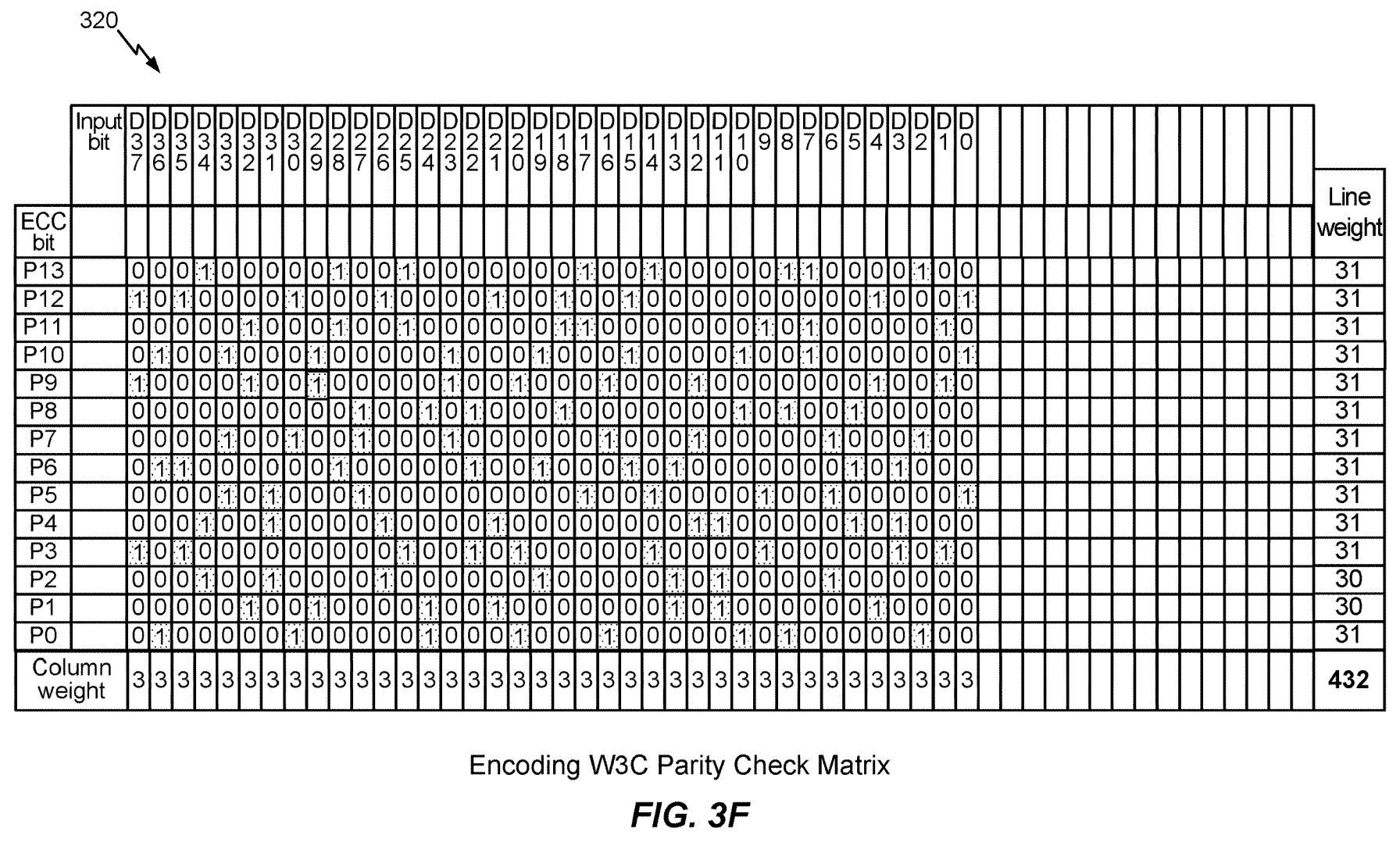
Figure 3G:
Figure 3H:
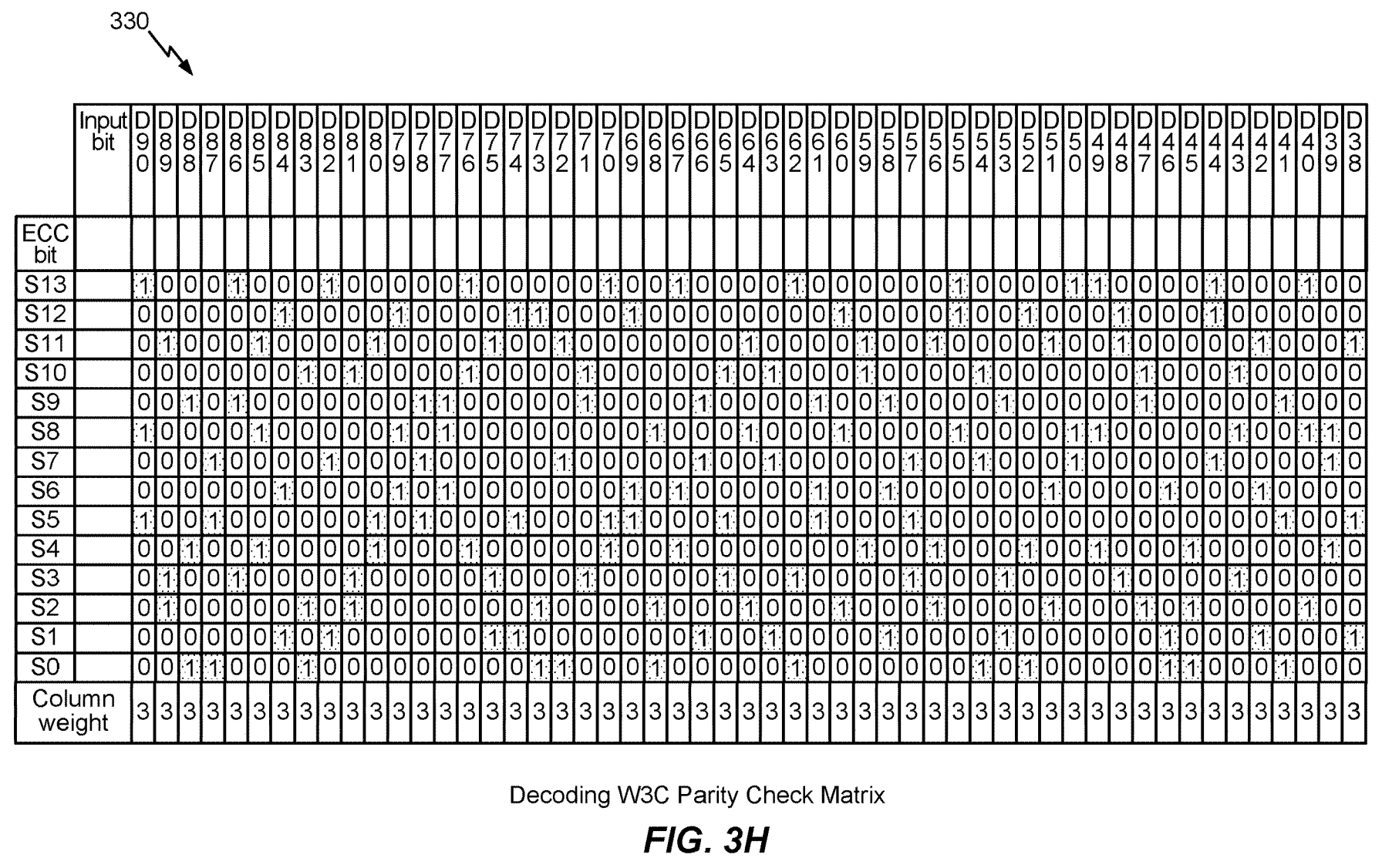
Figure 3I:
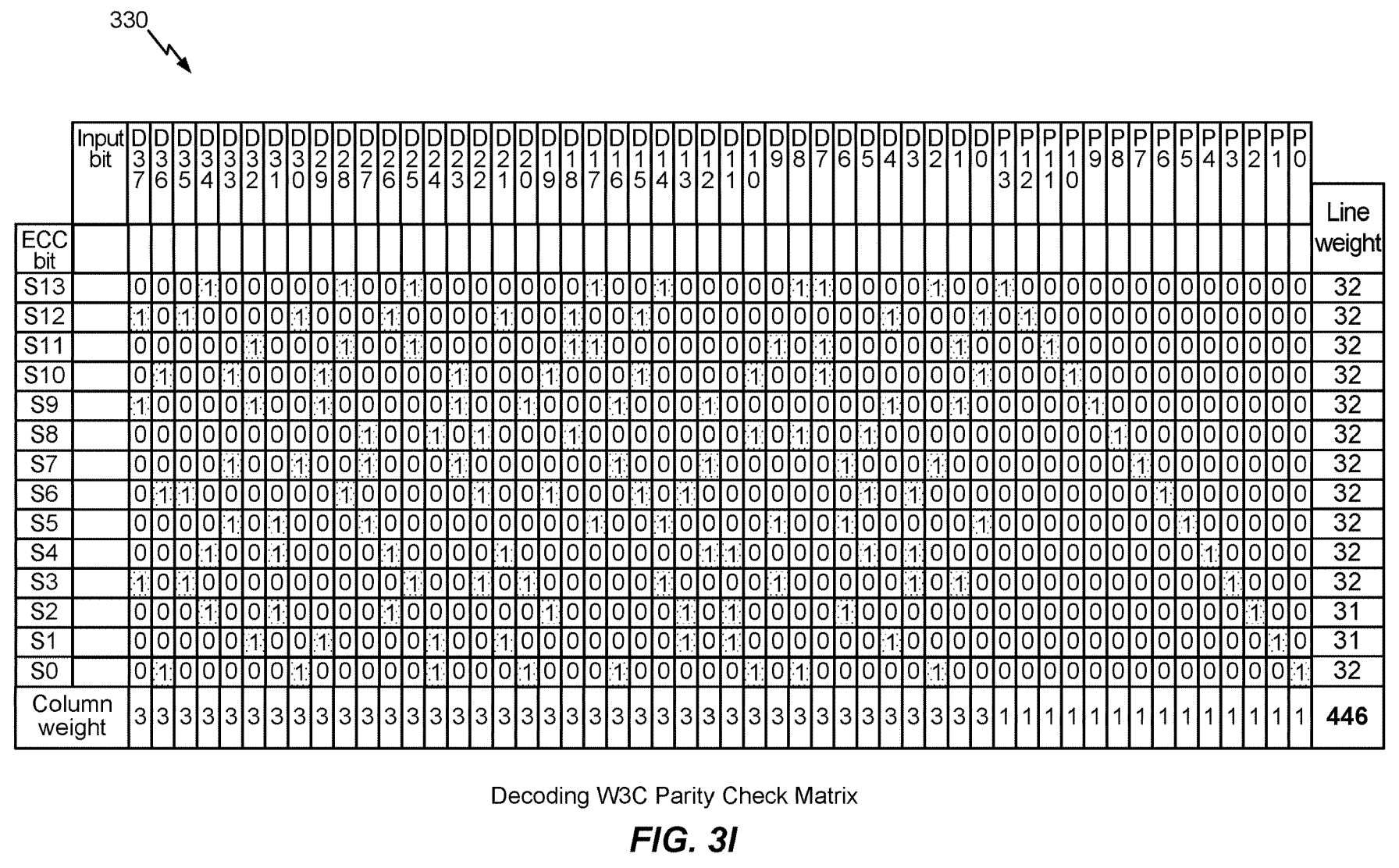

The ECC encoding check matrix is a subset or a restricted usage of the ECC decoding check matrix, illustrated in FIGS. 3G-3I. As such, the ECC decoding check matrix should be considered to define the ECC, while the ECC encoding check matrix is included for illustration purposes. Referring to FIG. FIGS. 3G-3I specifically, FIGS. 3G-3I illustrates an exemplary 14-bit W3C parity check matrix 330 that is an ECC decoding check matrix, that is, the parity check matrix generated by the receiver.

The 14-bit W3C parity check matrix 330 is as defined below. Input bits D0-D127, DM0-DM15, and P0-P13 appear in the bit locations defined above with respect to FIGS. 1D and 1E. The 14-bit W3C parity check matrix 330 should be interpreted the same as the 14-bit W3C parity check matrix 320. That is, scanning across from each ECC bit on the left (P0-P13), wherever a "1" appears in that row of the matrix, the bit at the top of that column is included in the XOR tree for that ECC bit. Output bits S0-S13 are the resulting ECC error syndrome. On a Write burst, DM0-DM15 are included in both the ECC generation and checking. On a Read burst, however, DM0-DM15 are treated as zeros by both the ECC generation and ECC checking logic.

As can be seen in FIGS. 3D-3F and 3G-3I, the encoding and decoding check matrices are identical except for the addition of P0-P13 as inputs to the decoding matrix, i.e., the 14-bit W3C parity check matrix 330. The 14-bit W3C parity check matrix 330, i.e., the ECC decoding check matrix, can thus be considered as the defining matrix for all of the ECC logic. This matrix can be used for both encoding and decoding. When used for encoding, the P0-P13 inputs are treated as zeros, but will be used as actual inputs during decoding. When encoding, the resulting ECC output bits (i.e., S0-S13) are used as the P0-P13 ECC bits to transmit over the interface.

Upon decoding, the resulting ECC error syndrome (i.e., S0-S13) will be zero if there are no ECC errors. When an error is detected, however, an error location vector is evaluated. Each error location bit is calculated by ANDing the three bits of the syndrome determined by the bit equal to "1" in the encoding matrix column. For example, input bit DM15 is erroneous if S13 & S12 & S11 is true.

When the syndrome is non-zero, the following equation is used to distinguish single bit errors (SBE) from multiple-bit errors (MBE): WEIGHT=S13+S12+S11+S10+S9+S8+S7+S6+S5+S4+S3+S2+S1+S0. WEIGHT will be "3" in the case of a single-bit error on the incoming data bit, and will be "1" in the case of a single-bit error on the incoming ECC bit. An uncorrectable error is detected when (a) the error location vector is "0" and WEIGHT>1, or (b) the error location vector is not "0" and WEIGHT is not "3."

Figure 4:
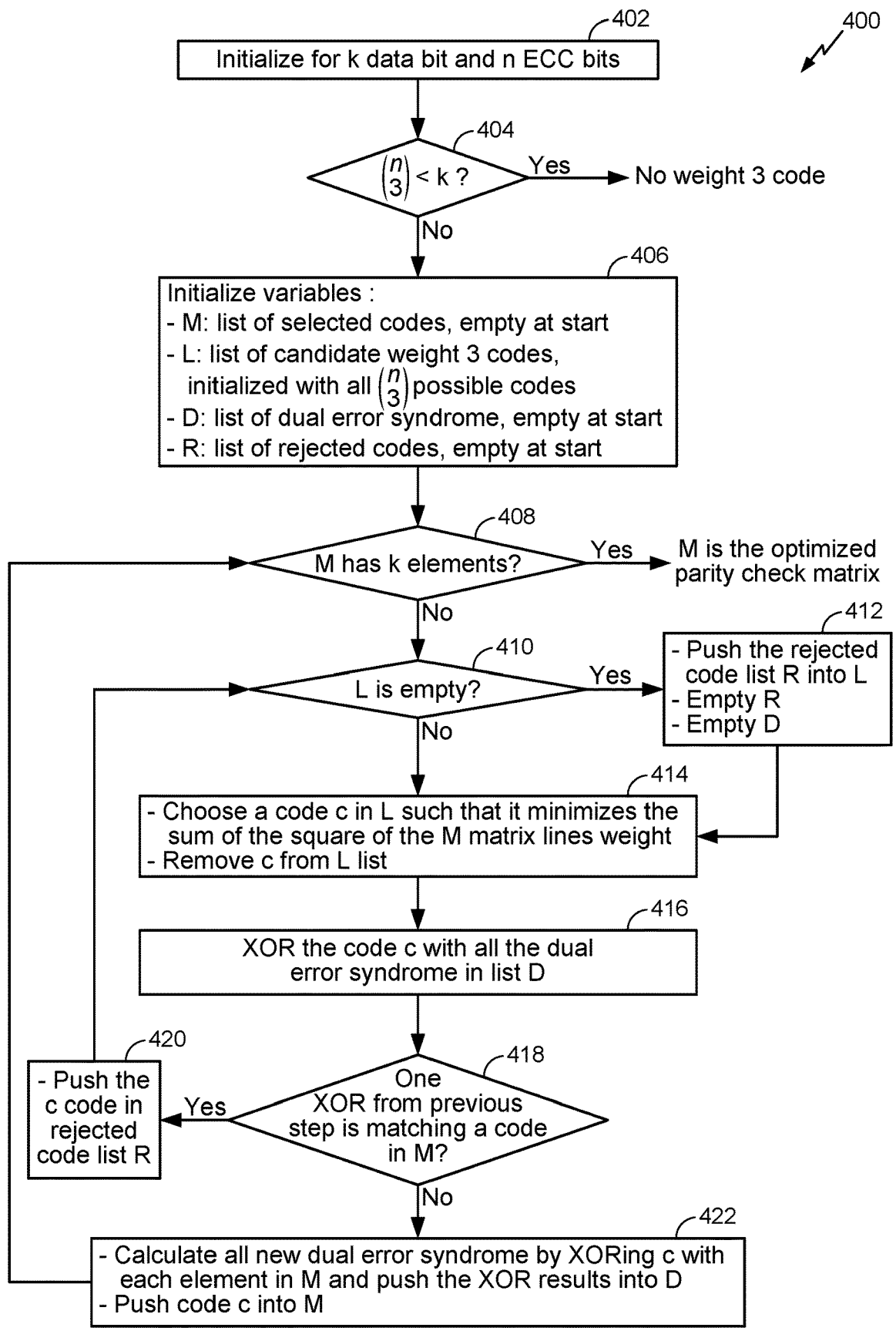
FIG. 4 illustrates an exemplary method for generating a "weight 3 code" parity check matrix according to at least one aspect of the disclosure.

Note that the illustrated W3C matrix is not any weight "3" code matrix; it has been optimized to maximize the error detection capability. Specifically, the optimized matrix construction algorithm for N-bit message protection is:

Given:
Empty list of code (M)
Empty list of dual error syndrome (D)
Empty list of rejected code (R)
1. Create the list of all possible "weight 3 codes" (L)
2. While M has less than N elements:
  a. Select a code in L that minimizes the maximum of the matrix lines weight
  b. XOR the selected code with each of the dual error syndrome list D
  c. If none of those XORs match an element in M:
    i. Code is accepted, push the code in M
    ii. Push all new dual error syndromes in D
  d. Else:
    i. Code is rejected, push the code in R
  e. If L is empty:
    i. Push the rejected code list R into L
    ii. Empty D and R FIG. 4 illustrates an exemplary method 400 for generating a W3C parity check matrix according to the above algorithm. At 402, the method 400 initializes for k (e.g., 144-128 data bits and 16 DM bits) data bits and n (e.g., 14) ECC bits. At 404, the method 400 determines whether "n choose three" (i.e., the number of choices of three elements among n), denoted "

$$\binom{n}{3},$$

"is less than k. The denominator "3" is chosen because, as shown above in FIGS. 3D-3F, the weight of each column in a "weight 3 code" is three. If $$\binom{n}{3}$$

is less than k, then no "weight 3 code" exists for a k-bit message. If, however, $$\binom{n}{3}$$

is not less than k, then at 406, the method 400 initializes the variables M, L, D, and R. M is the list of selected "weight 3 codes" and is empty at the start of method 400. L is the list of candidate "weight 3 codes" and is initialized with all $$\binom{n}{3}$$

possible codes. D is the list of dual error syndromes (meaning that at least two errors can be detected) and is empty at the start of method 400. R is the list of rejected "weight 3 codes" and is empty at the start of method 400.

At 408, the method 400 determines whether or not M has k elements. If it does, then M is the optimized parity check matrix. If M does not have k elements, then at 410, the method 400 determines whether or not L is empty. If it is, then at 412, the method 400 pushes the rejected code list R into L, empties R, and empties D. The method 400 then proceeds to 414. Note that if L is not empty, the method 400 proceeds directly to 414.

At 414, the method 400 chooses a code c in L such that it minimizes the sum of the square of the M matrix lines weight and removes c from the list L. At 416, the method 400 XORs the code c with all of the dual error syndromes in list D. At 418, the method determines whether or not at least one XOR from 416 matches a code in M. If at least one does, then the method 400 proceeds to 420, where the method 400 pushes the code c into the rejected code list R. The method 400 then returns to 410. If no XOR from 416 matches a code in M, then at 422, the method 400 calculates all new dual error syndromes by XORing the code c with each element in M and pushes the XOR result into D. The method 400 also pushes the code c into M. The method 400 then returns to 408.

Thus, in an aspect, a method for generating a parity check matrix representing an ECC for protecting a plurality of bits of a message may include initializing a matrix M to store selected three-bit codes, as at 406 of FIG. 4. In an aspect, each row of the matrix M may be associated with a row weight, and the row weight of each row of the matrix M may indicate a number of set bits in the row. The method may further include selecting a first three-bit code from a set L of three-bit combinations of a number of bits n of the ECC that minimizes a sum of squared row weights of each row of the matrix M, as at 414 of FIG. 4. The method may further include comparing the first three-bit code with each of a plurality of error syndromes in a set D of error syndromes, as at 416 of FIG. 4. The method may further include calculating, based on no comparison of the first three-bit code with each of the plurality of error syndromes in the set D of error syndromes matching a three-bit code in the matrix M, new error syndromes and storing the new error syndromes in the set D of error syndromes, as at 422 of FIG. 4. In an aspect, the new error syndromes may be calculated by comparing the first three-bit code with each three-bit code in the matrix M. The method may further include storing the first three-bit code in the matrix M, as at 422 of FIG. 4.

Table 1 provides a performance comparison between a 9-bit ECC (e.g., a 9-bit Hamming code) and a 14-bit W3C:

TABLE 1

| | Detect and Correct Code Type | | |
|---|---|---|---|
| | Hamming | W3C | |
| | ECC bits | | |
| Correction and Detection | 9-bit 144-bit message + ECC bits | 14-bit 144-bit message + ECC bits | |
| Single error correct | 100% | 100% | Correction capability |
| 1 random error detect | 100% | 100% | Detection capability |
| 2 random error detect | 100% | 100% | |
| 3 random error detect | 28.2% | 93.6% | |
| 4 random error detect | 99.5% | 99.96% | |
| 5 random error detect | 35.1% | 96.9% | |
| 6 random error detect | 99.6% | 99.98% | |
| Est. critical path depth | 16 | 14 | Speed |
| Est. gate count | 1349 | 856 | Power/area |

As can be seen in Table 1, with a higher number of parity bits, an ECC can be chosen such that error detection capability is significantly better and the hardware is faster and takes less area.

FIG. 5 illustrates an exemplary ECC module 500 for a 9-bit ECC (e.g., a 9-bit Hamming code) according to at least one aspect of the disclosure. As illustrated in FIG. 5, a parity bit encoder 510 receives 144 bits (e.g., 128 data bits and 16 DM bits) of input data (Din) over 16 beats and generates, after all 144 bits have been received, nine parity bits (P). The parity bit encoder 510 includes nine XOR trees, one for each parity bit, the largest one having 75 inputs (as 75 is the largest line weight in FIG. FIGS. 3A-3C). The output P of the nine XOR trees is passed to nine 2-input XOR gates 512 that also receive as input ECC in (the nine parity bits of the received ECC). The output of the nine 2-input XOR gates 512 is the error syndrome bits, which are passed to a data error locator 520, an input ECC bits error locator 530, and a 9-input OR gate 526.

FIG. 5 illustrates an exemplary ECC module 500 for a 9-bit ECC (e.g., a 9-bit Hamming code) according to at least one aspect of the disclosure. As illustrated in FIG. 5, a parity bit encoder 510 receives 144 bits (e.g., 128 data bits and 16 DM bits) of input data (Din) over 16 beats and generates, after all 144 bits have been received, nine parity bits (P). The parity bit encoder 510 includes nine XOR trees, one for each parity bit, the largest one having 75 inputs (as 75 is the largest line weight in FIG. 3A). The output P of the nine XOR trees is passed to nine 2-input XOR gates 512 that also receive as input ECCin (the nine parity bits of the received ECC). The output of the nine 2-input XOR gates 512 is the error syndrome bits, which are passed to a data error locator 520, an input ECC bits error locator 530, and a 9-input OR gate 526.

The data error locator 520 includes 144 9-input AND gates. The 144 outputs of the 9-input AND gates in the data error locator 520 is the error location vector (e) and is passed to 144 2-input XOR gates 522 that also receive as input Din and output Dout. The output of the data error locator 520 and the output from the ECC bits error locator 530 are passed to a 153-input OR gate 524. The output of the 153-input OR gate 524 indicates whether or not a correctable single error has been detected. A 2-input AND gate 528 that takes as input the opposite of the output of the 153-input OR gate 524 and the output of a 9-input OR gate 526 outputs a bit indicating whether or not a multiple uncorrectable error has been detected.

FIG. 6A illustrates an exemplary ECC module 600 for a 14-bit W3C according to at least one aspect of the disclosure. As illustrated in FIG. 6A, a parity bit encoder 610 receives 144 bits (e.g., 128 data bits and 16 DM bits) of input data (Din) over 16 beats and generates, after all 144 bits have been received, 14 parity bits (P). The parity bit encoder 610 includes 14 XOR trees, one for each parity bit, the largest one having 31 inputs (as 31 is the largest line weight in FIGS. 3D-3F). The output P of the 14 XOR trees is passed to 14 2-input XOR gates 612, which also receives as input ECCin (the 14 parity bits of the received ECC). The output of the 14 2-input XOR gates 612 is the error syndromes, which are passed to an error locator 620 and an adder 630. The error locator 620 includes 144 3-input AND gates. The output of the 144 3-input AND gates of the error locator 620 is the error location vector (e) and is passed to 144 2-input XOR gates 622 that also receive as input the Din and output Dout. The output of the error locator 620 is also passed to a 144-input OR gate 624. The output of the 144-input OR gate 624 and the result of testing the adder output equal to "3" are passed to a 2-input AND gate 632. The output of the 2-input AND gate 632 and the result of testing the adder output equal to "1" are passed to a 2-input OR gate 634. The opposite of the output of the 2-input OR gate 634 and the result of testing the adder output not equal to "0" are passed to a 2-input AND gate 636. The output of the 2-input OR gate 634 indicates whether or not a correctable single error has been detected, and the output of the 2-input AND gate 636 indicates whether or not a multiple uncorrectable error has been detected.

Thus, in an aspect, an apparatus for detecting an error in a plurality of bits of a message protected by an ECC may include a parity bit encoder (e.g., parity bit encoder 610) configured to receive the plurality of bits of the message and to output a plurality of parity bits for the plurality of bits of the message. In an aspect, a number of the plurality of parity bits may be greater than a minimum number of bits required for SECDED protection of the plurality of bits of the message (e.g., 14), and a number of the plurality of bits of the ECC may be greater than the minimum number of bits required for SECDED protection of the plurality of bits of the message (e.g., 14). The apparatus may further include a first comparator (e.g., 14 2-input XOR gates 612) configured to compare the plurality of parity bits to the plurality of bits of the ECC and to output an error syndrome. In an aspect, the error syndrome may be a plurality of bits representing results of comparisons between the plurality of parity bits and the plurality of bits of the ECC. The apparatus may further include an error locator (e.g., error locator 620) configured to receive the error syndrome and to output an error location vector representing which bits of the plurality of bits of the message are in error. The apparatus may further include a second comparator (e.g., 144 2-input XOR gates 622) configured to compare the error location vector to the plurality of bits of the message and to output a corrected version of the plurality of bits of the message.

Figure 6B:
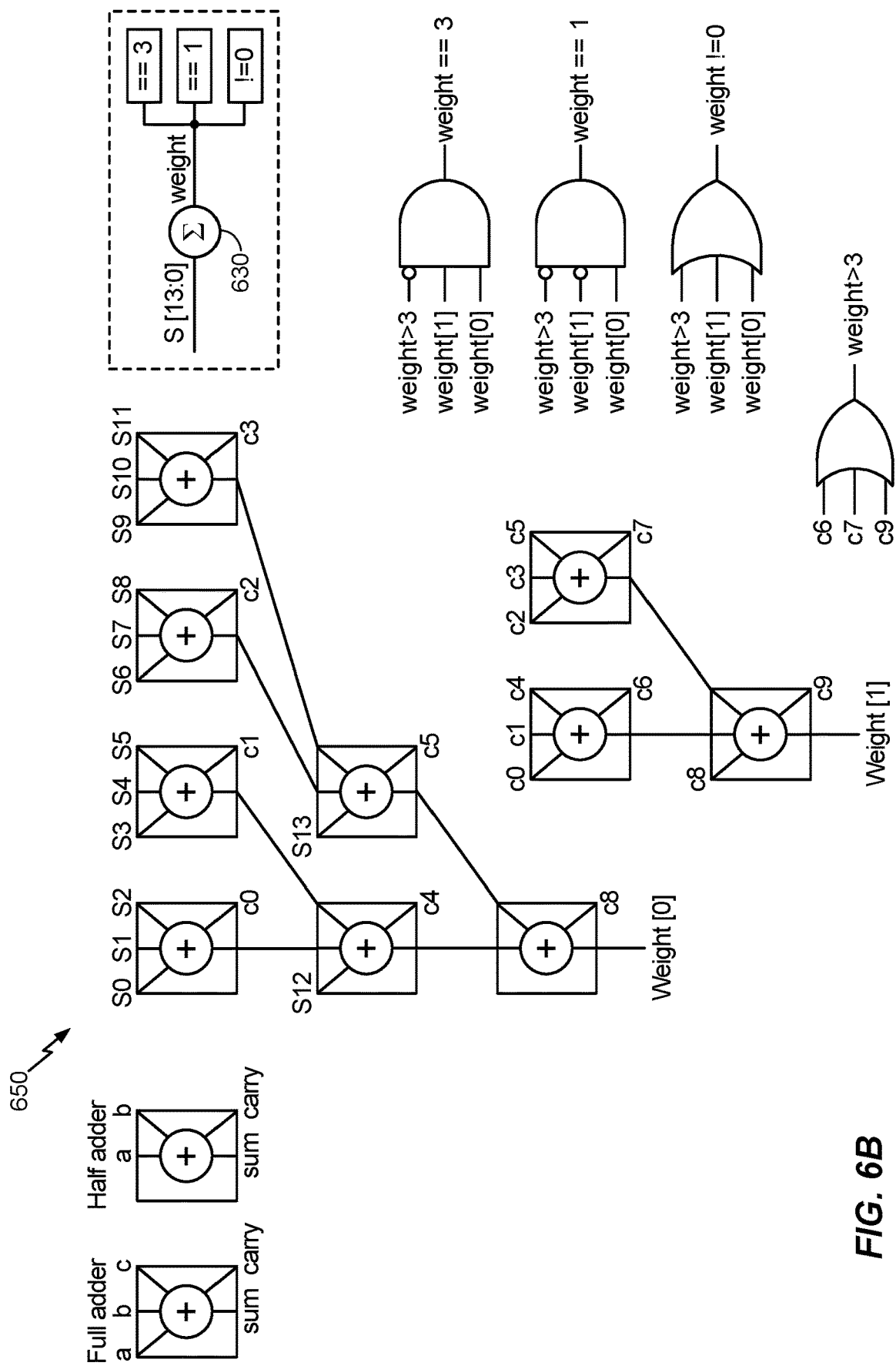
FIG. 6B illustrates an exemplary optimized implementation of the weight condition calculation described in FIG. 6A, according to at least one aspect of the disclosure.

FIG. 6B illustrates an exemplary optimized implementation 650 of the weight condition calculation described in FIG. 6A, according to at least one aspect of the disclosure. FIG. 6B depicts an optimized implementation of the calculation of the weight comparison flags: "weight equals 3," "weight equals 1," and "weight not equal to 0." To do so, only the two least significant bits of the weight are calculated (weight[0] and weight[1]) as well as a flag indicating whether the weight is greater than three (weight>3). A first tree of full adders and half adders partially sums the input syndrome bits to calculate weight[0] and the intermediate carry bits C0, C1, C2, C3, C4, C5, and C8 that will be passed to the second stage adder tree. A second full adder tree partially sums the carry bits from the first stage adder tree to calculate weight[1] and the intermediate carry bits C6, C7, and C9 that will be used to determine whether the weight is greater than three. The weight is greater than three if and only if one of the second stage carry bits is not zero. A 3-input OR gate is used to calculate this condition.

The "weight equals 3" condition is calculated by a first 3-input AND gate whose output is true if the two least significant bit of the weight are "1" and the weight is not greater than "3." The "weight equals 1" condition is calculated by a second 3-input AND gate whose output is true if the least significant bit of the weight is "1" and the second least significant bit of the weight is "0" and the weight is not greater than "3." The "weight not equal to zero" condition is calculated by a 3-input OR gate whose output is true if at least one of the intermediate carry bits C6, C7, or C8 from the second adder stage is not zero.

As can be seen from FIGS. 5 and 6A, increasing the number of bits of the ECC from the minimum of nine to 14 decreases the size of the AND gates in the error locator from a 9-input AND gate (data error locator 520) to a 3-input AND gate (error locator 620). This is a substantial reduction in circuit complexity, and therefore size and cost. In addition, using a 14-bit, for example, ECC improves the detection strength of the ECC, and thereby improves the link robustness of the interface between the sender and receiver.

Tables 2 and 3 illustrate the detection performance using a code generated by the method described herein.

TABLE 2

| SECDED Matrix created according to the present disclosure | | | | |
|---|---|---|---|---|
| | 9-bit | 10-bit | 11-bit | 12-bit |
| Single error correct | 100% | 100% | 100% | 100% |
| Maximum XOR tree input | 62 | 48 | 40 | 37 |
| Total XOR trees input | 552 | 480 | 432 | 432 |
| Maximum code weight | 5 | 5 | 3 | 3 |
| 2 random error detect | 100% | 100% | 100% | 100% |
| 3 random error detect | 40.26% | 65.55% | 76.68% | 85.38% |
| 4 random error detect | 99.60% | 99.77% | 99.85% | 99.90% |
| 5 random error detect | 40.24% | 69.51% | 83.25% | 90.76% |
| 6 random error detect | 99.61% | 99.80% | 99.89% | 99.94% |
| 2 random error miss | 0% | 0% | 0% | 0% |
| 3 random error miss | 59.74% | 34.45% | 23.32% | 14.62% |
| 4 random error miss | 0.40% | 0.23% | 0.15% | 0.10% |
| 5 random error miss | 59.76% | 30.49% | 16.75% | 9.24% |
| 6 random error miss | 0.39% | 0.20% | 0.11% | 0.06% |

TABLE 3

| SECDED Matrix created according to the present disclosure | | | | |
|---|---|---|---|---|
| | 13-bit | 14-bit | 15-bit | 16-bit |
| Single error correct | 100% | 100% | 100% | 100% |
| Maximum XOR tree input | 34 | 31 | 29 | 28 |
| Total XOR trees input | 432 | 432 | 432 | 432 |
| Maximum code weight | 3 | 3 | 3 | 3 |
| 2 random error detect | 100% | 100% | 100% | 100% |
| 3 random error detect | 90.50% | 93.58% | 95.53% | 96.80% |
| 4 random error detect | 99.94% | 99.96% | 99.97% | 99.98% |
| 5 random error detect | 94.73% | 96.89% | 98.11% | 98.81% |
| 6 random error detect | 99.97% | 99.98% | 99.99% | 99.99% |
| 2 random error miss | 0% | 0% | 0% | 0% |
| 3 random error miss | 9.50% | 6.42% | 4.47% | 3.20% |
| 4 random error miss | 0.06% | 0.04% | 0.03% | 0.02% |

TABLE 3-continued

SECDED Matrix created according to the present disclosure

|  | 13-bit | 14-bit | 15-bit | 16-bit |
|---|---|---|---|---|
| 5 random error miss | 5.27% | 3.11% | 1.89% | 1.19% |
| 6 random error miss | 0.03% | 0.02% | 0.01% | 0.01% |

Figure 7:
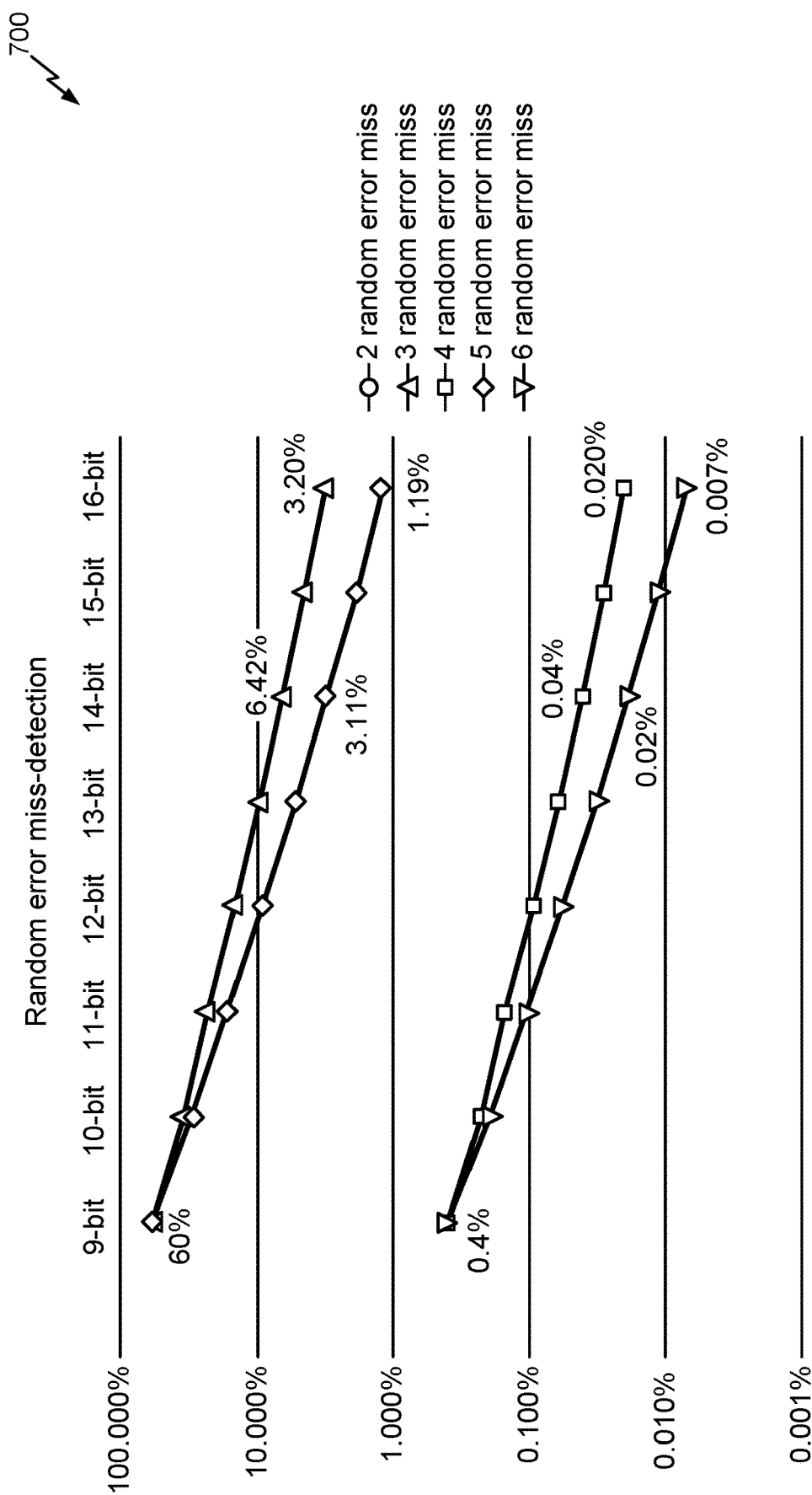
FIG. 7 illustrates a graph of random error miss detection utilizing the ECC of the present disclosure.

FIG. 7 illustrates a graph 700 of random error miss detection utilizing the ECC of the present disclosure. As illustrated in FIG. 7, as the number of bits of the ECC increases, the better the error detection.

Figure 8:
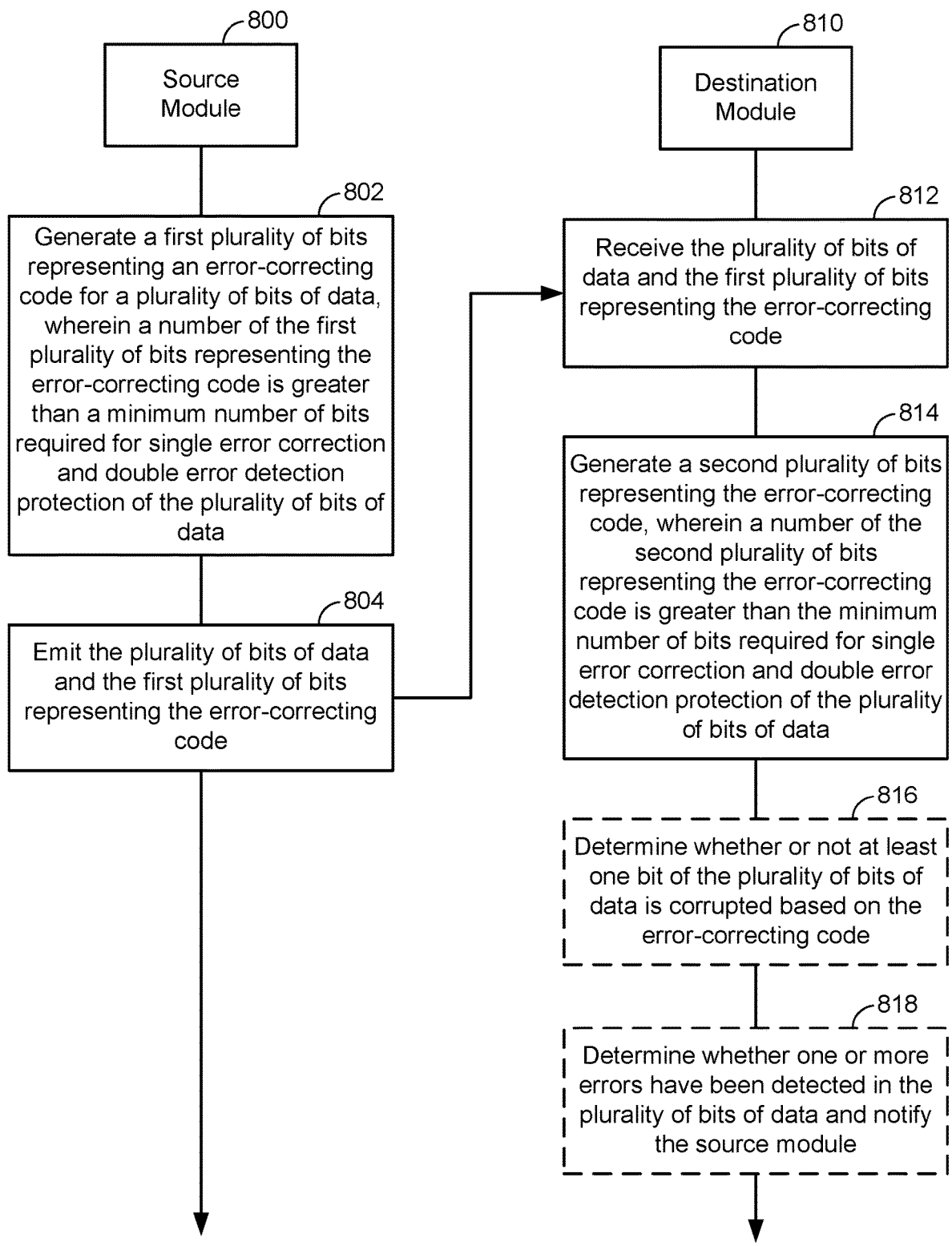
FIG. 8 illustrates an exemplary method for detecting and correcting errors in a message protected with error-correcting code bits according to at least one aspect of the disclosure.

FIG. 8 illustrates an exemplary method for detecting and correcting errors in a message protected with error-correcting code bits according to at least one aspect of the disclosure. The method may be performed by a source module 800 and a destination module 810 connected over a high-speed data link. In an aspect, the source module 800 may be a SoC and the destination module 810 may be an LPDDR memory module. However, because communications over the high-speed data link is bidirectional, the source module 800 may be the LPDDR memory module and the destination module 810 may be the SoC, depending on which of the LPDDR memory module or the SoC is currently transmitting data.

At 802, the source module 800 generates a first plurality of bits representing an ECC for a plurality of bits of data, such as a line of data (e.g., Din in FIG. 6). In an aspect, the number of the first plurality of bits representing the ECC is greater than the minimum number of bits required for SECMED protection of the plurality of bits of data. For example, where the minimum number of bits required for SECMED is nine bits, the number of bits representing the ECC may be greater than nine bits (e.g., 14 bits, 16 bits, etc.). At 804, the source module 800 emits the plurality of bits of data and the first plurality of bits representing the ECC to the destination module 810.

At 812, the destination module 810 receives the plurality of bits of data and the first plurality of bits representing the ECC. At 814, the destination module 810 generates a second plurality of bits representing the ECC. In an aspect, the number of the second plurality of bits representing the ECC is greater than the minimum number of bits required for SECMED protection of the plurality of bits of data. At 816, the destination module 810 optionally determines whether or not at least one bit of the plurality of bits of data is corrupted based on the ECC. At 818, the destination module 810 optionally determines whether one or more errors have been detected in the plurality of bits of data and sends this information back to the source module 800 so that the transaction can be retried. Note that operation 816 effectively performs error correction as in the FEC method, whereas operation 818 is the detection part of the ARQ method. When only operation 816 is performed, the error correction method is the FEC method. When only operation 818 is performed, the error correction method is the ARQ method. When both 816 and 818 are performed, the error correction method is the HARQ method.

Figure 9:
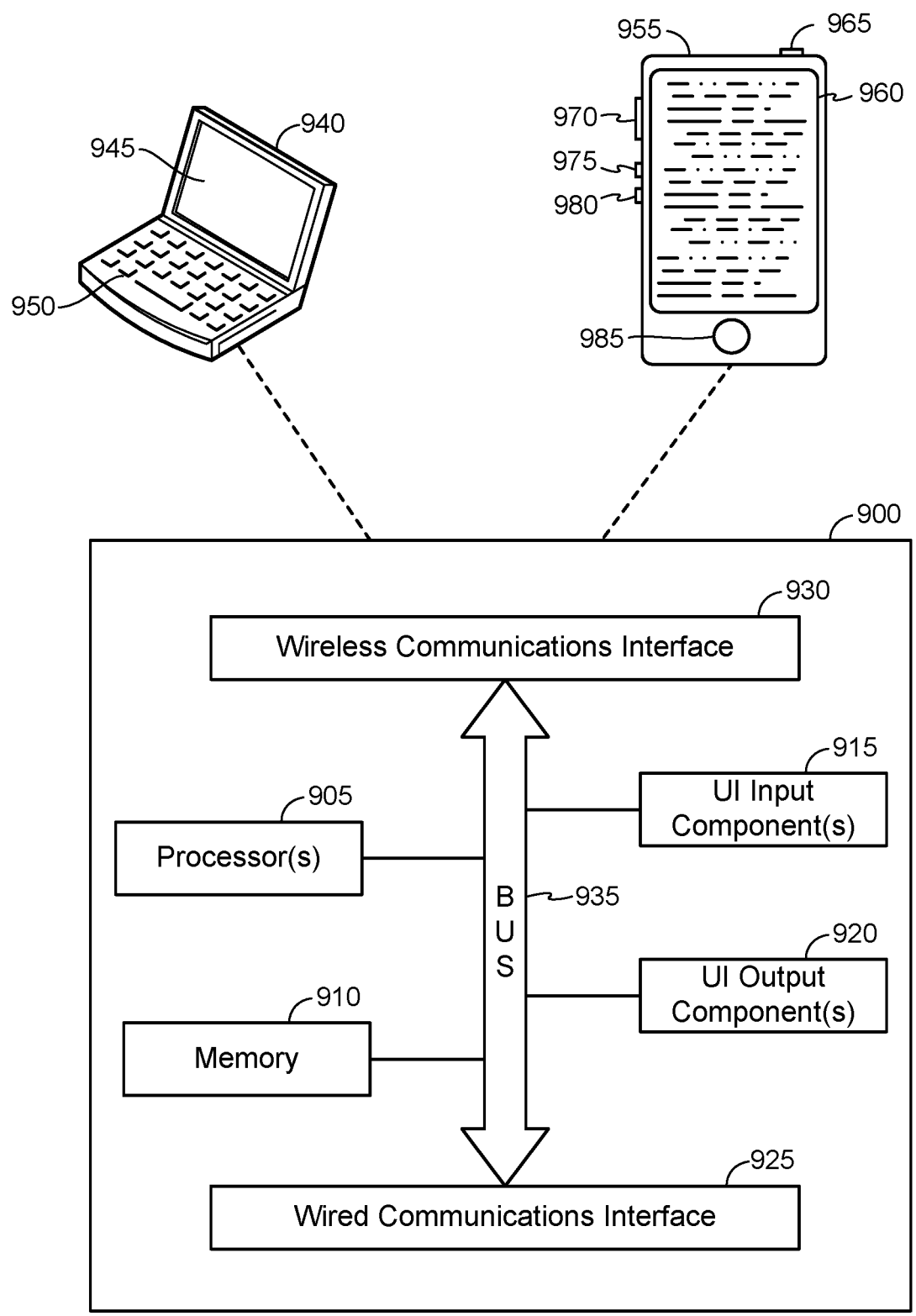
FIG. 9 illustrates examples of mobile devices in accordance with at least one aspect of the disclosure.

FIG. 9 illustrates a mobile device 900 in which the techniques described herein can be implemented in accordance with an aspect of the disclosure. In an aspect, the mobile device 900 includes one or more processors 905 (e.g., one or more ASICs, one or more digital signal processors (DSPs), one or more SoCs (e.g., SoC device 110), etc.) and a memory 910 (e.g., Random Access Memory (RAM), SDRAM (e.g., LPDDR memory module 120), Read-Only Memory (ROM), Electrically Erasable Programmable ROM (EEPROM), flash cards, or any memory common to computer platforms). The mobile device 900 also includes one or more user interface (UI) input components 915 (e.g., a keyboard and mouse, a touchscreen, a microphone, one or more buttons such as volume or power buttons, etc.) and one or more UI output components 920 (e.g., speakers, a display screen, a vibration device for vibrating the mobile device 900, etc.).

The mobile device 900 further includes a wired communications interface 925 and a wireless communications interface 930. In an example aspect, the wired communications interface 925 can be used to support wired local connections to peripheral devices (e.g., a Universal Serial Bus (USB) connection, a mini USB or lightning connection, a headphone jack, graphics ports such as serial, Video Graphics Array (VGA), High-Definition Multimedia Interface (HDMI), Digital Visual Interface (DVI), or DisplayPort, audio ports, and so on) and/or to a wired access network (e.g., via an Ethernet cable or another type of cable that can function as a bridge to the wired access network such as HDMI v1.4 or higher, etc.). In another example aspect, the wireless communications interface 930 includes one or more wireless transceivers for communication in accordance with a local wireless communications protocol (e.g., Wireless Local Area Network (WLAN) or WiFi, WiFi Direct, Long-Term Evolution (LTE)-Direct, Bluetooth, etc.). The wireless communications interface 930 may also include one or more wireless transceivers for communication with a cellular radio access network (RAN) (e.g., via Code Division Multiple Access (CDMA), Wideband-CDMA (W-CDMA), Time-Division Multiple Access (TDMA), Frequency-Division Multiple Access (FDMA), Orthogonal Frequency-Division Multiplexing (OFDM), Global System of Mobile Communication (GSM), or other protocols that may be used in a wireless communications network or a data communications network). The various components 905-930 of the mobile device 900 can communicate with each other via a bus 935.

Referring to FIG. 9, the mobile device 900 may correspond to any type of mobile and/or battery powered device, including but not limited to a smart phone, a laptop computer, a desktop computer, a tablet computer, a wearable device (e.g., a pedometer, a smart watch, etc.) and so on. Two particular implementation examples of the mobile device 900 are depicted in FIG. 9, which are illustrated as laptop 940 and touchscreen device 955 (e.g., a smart phone, a tablet computer, etc.). The laptop 940 includes a display screen 945 and a UI area 950 (e.g., keyboard, touchpad, power button, etc.), and while not shown, the laptop 940 may include various ports as well as wired and/or wireless transceivers (e.g., Ethernet card, WiFi card, broadband card, etc.).

The touchscreen device 955 is configured with a touchscreen display 960, peripheral buttons 965, 970, 975, and 980 (e.g., a power control button, a volume or vibrate control button, an airplane mode toggle button, etc.), and at least one front-panel button 985 (e.g., a Home button, etc.), among other components, as is known in the art. While not shown explicitly as part of the touchscreen device 955, the touchscreen device 955 can include one or more external antennas and/or one or more integrated antennas that are built into the external casing of the touchscreen device 955, including but not limited to WiFi antennas, cellular antennas, satellite position system (SPS) antennas (e.g., global positioning system (GPS) antennas), and so on.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA), an SoC, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in RAM (including DRAM, DDR, SDRAM, etc.), flash memory, ROM, erasable programmable ROM (EPROM), EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a mobile and/or battery-operated device. In the alternative, the processor and the storage medium may reside as discrete components in a mobile and/or battery-operated device.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM (including DRAM, DDR, SDRAM, etc.), ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blue-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An apparatus for detecting an error in a plurality of bits of a message protected by a weight-3 code (W3C), comprising:
    a parity bit encoder configured to receive the plurality of bits of the message and to output a plurality of parity bits for the plurality of bits of the message, wherein a number of the plurality of parity bits is greater than a minimum number of bits required for single error correction and double error detection (SECDED) protection of the plurality of bits of the message, wherein the W3C comprises a plurality of bits, wherein a number of the plurality of bits of the W3C is greater than the minimum number of bits required for SECDED protection of the plurality of bits of the message, and wherein the W3C provides single error correction and at least double error detection protection of the plurality of bits of the message;
    a first comparator configured to compare the plurality of parity bits to the plurality of bits of the W3C and to output an error syndrome, wherein the error syndrome comprises a plurality of bits representing results of comparisons between the plurality of parity bits and the plurality of bits of the W3C;
    an error locator configured to receive the error syndrome and to output an error location vector representing which bits of the plurality of bits of the message are in error; and
    a second comparator configured to compare the error location vector to the plurality of bits of the message and to output a corrected version of the plurality of bits of the message.

2. The apparatus of claim 1, wherein the parity bit encoder comprises a plurality of exclusive OR (XOR) gates, wherein a number of the plurality of XOR gates is the number of the plurality of parity bits.

3. The apparatus of claim 2, wherein the number of the plurality of XOR gates is greater than nine.

4. The apparatus of claim 2, wherein the number of the plurality of XOR gates is 14.

5. The apparatus of claim 2, wherein a largest XOR gate of the plurality of XOR gates is a 31-input XOR gate.

6. The apparatus of claim 1, wherein the number of the plurality of bits of the message is 144.

7. The apparatus of claim 1, wherein the first comparator comprises a plurality of two-input XOR gates, and wherein a number of the plurality of two-input XOR gates is the number of the plurality of parity bits.

8. The apparatus of claim 7, wherein a first input of each of the plurality of two-input XOR gates is a bit of the plurality of bits of the W3C and a second input of each of the plurality of two-input XOR gates is a bit of the plurality of parity bits.

9. The apparatus of claim 7, wherein the number of the plurality of two-input XOR gates is 14.

10. The apparatus of claim 1, wherein a number of the plurality of bits of the error syndrome is the number of the plurality of parity bits.

11. The apparatus of claim 1, wherein the error locator comprises a plurality of three-input AND gates, and wherein a number of the plurality of three-input AND gates is the number of the plurality of bits of the message.

12. The apparatus of claim 11, wherein the number of the plurality of three-input AND gates is 144.

13. The apparatus of claim 1, wherein the second comparator comprises a plurality of two-input XOR gates, wherein a number of the plurality of two-input XOR gates is the number of the plurality of bits of the message.

14. The apparatus of claim 13, wherein a length of the error location vector is the number of the plurality of bits of the message.

15. The apparatus of claim 13, wherein a first input of each of the plurality of two-input XOR gates is a bit of the plurality of bits of the message and a second input of each of the plurality of two-input XOR gates is a bit of the error location vector.

16. An apparatus for detecting an error in a plurality of bits of a message protected by weight-3 code (W3C), comprising:
  means for parity bit encoding configured to receive the plurality of bits of the message and to output a plurality of parity bits for the plurality of bits of the message, wherein a number of the plurality of parity bits is greater than a minimum number of bits required for single error correction and double error detection (SECDED) protection of the plurality of bits of the message, wherein the W3C comprises a plurality of bits, wherein a number of the plurality of bits of the W3C is greater than the minimum number of bits required for SECDED protection of the plurality of bits of the message, and wherein the W3C provides single error correction and at least double error detection protection of the plurality of bits of the message;
  a first means for comparing configured to compare the plurality of parity bits to the plurality of bits of the W3C and to output an error syndrome, wherein the error syndrome comprises a plurality of bits representing results of comparisons between the plurality of parity bits and the plurality of bits of the W3C;
  a means for error locating configured to receive the error syndrome and to output an error location vector representing which bits of the plurality of bits of the message are in error; and
  a second means for comparing configured to compare the error location vector to the plurality of bits of the message and to output a corrected version of the plurality of bits of the message.

* * * * *